United States Patent [19]
Allred, Jr. et al.

[11] Patent Number: 4,746,856
[45] Date of Patent: May 24, 1988

[54] SEMICONDUCTOR TESTING AND APPARATUS THEREFOR

[75] Inventors: Laurence L. Allred, Jr.; Bradley N. Lange, both of Chandler, Ariz.

[73] Assignee: Advanced Semiconductor Materials America, Inc., Tempe, Ariz.

[21] Appl. No.: 714,194

[22] Filed: Mar. 20, 1985

Related U.S. Application Data

[62] Division of Ser. No. 363,641, Mar. 18, 1985, Pat. No. 4,520,313.

[51] Int. Cl.⁴ .................. G01R 31/02; G01R 31/28
[52] U.S. Cl. .......................... 324/158 R; 324/73 R
[58] Field of Search ............... 324/158 R, 158 D, 96, 324/73 R; 358/182, 106, 107; 356/401

[56] References Cited

U.S. PATENT DOCUMENTS 4,051,437 9/1977 Lile et al. .................. 324/158 D
4,360,831 11/1982 Kellar ........................ 358/182

Primary Examiner—Ernest F. Karlsen
Attorney, Agent, or Firm—Harry M. Weiss & Associates

[57] ABSTRACT

A semiconductor die is positioned and examined by means of scanning certain strategic regions which border or overlap said die. The video which results from the scanning is digitized. For example, black is represented by an "0" and white is represented by a "1". The results may be compared with an acceptable pattern to determine a good die and statistically analyzed to see if the data represents the die or surrounding street.

8 Claims, 34 Drawing Sheets

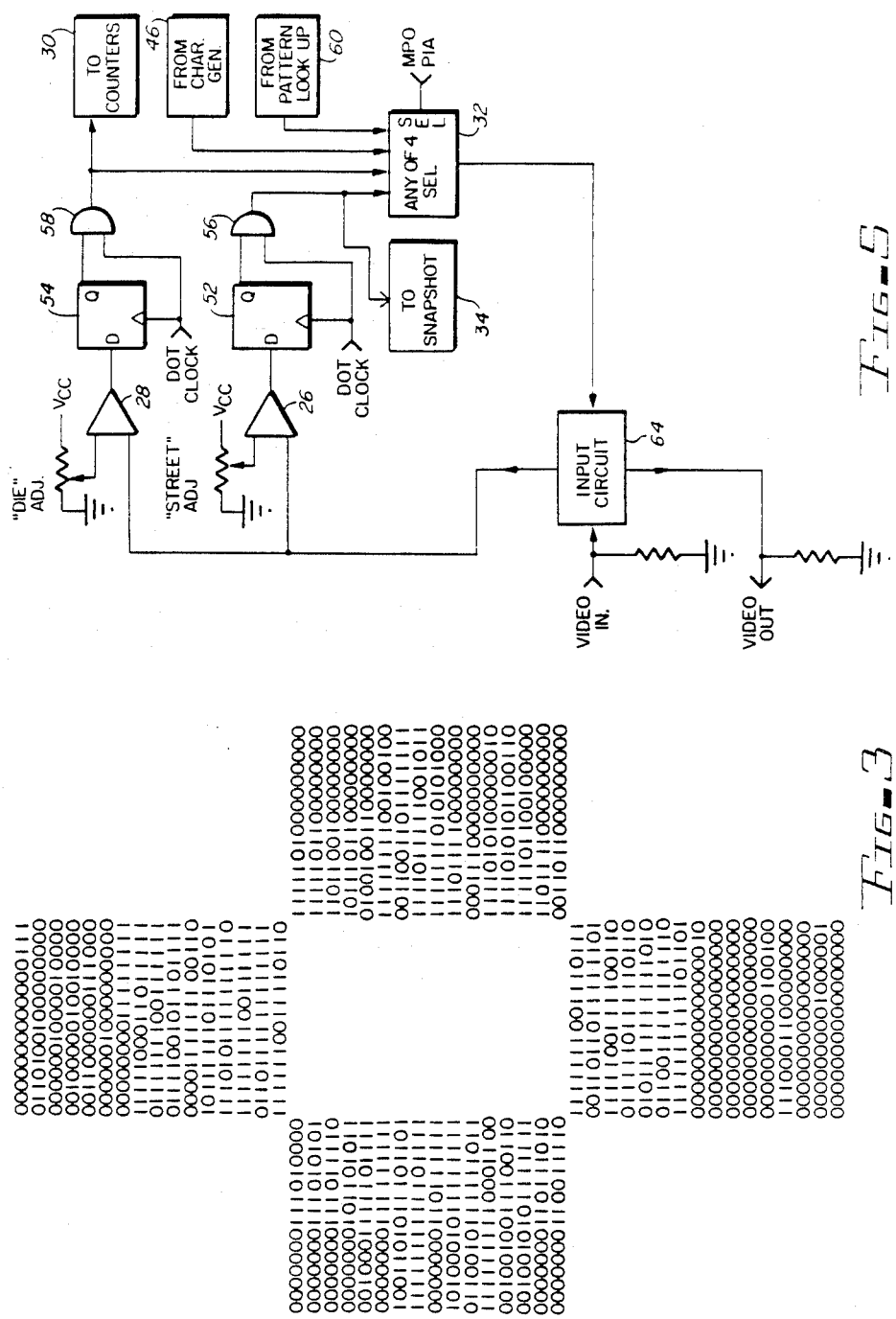

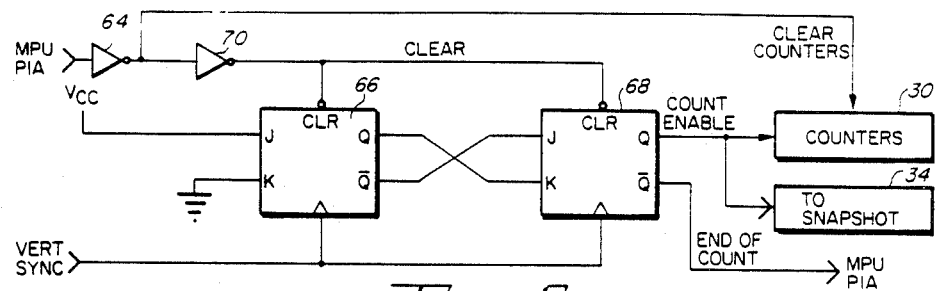
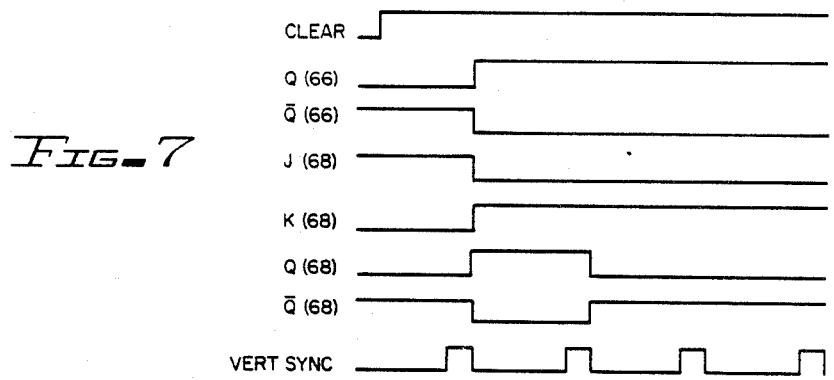
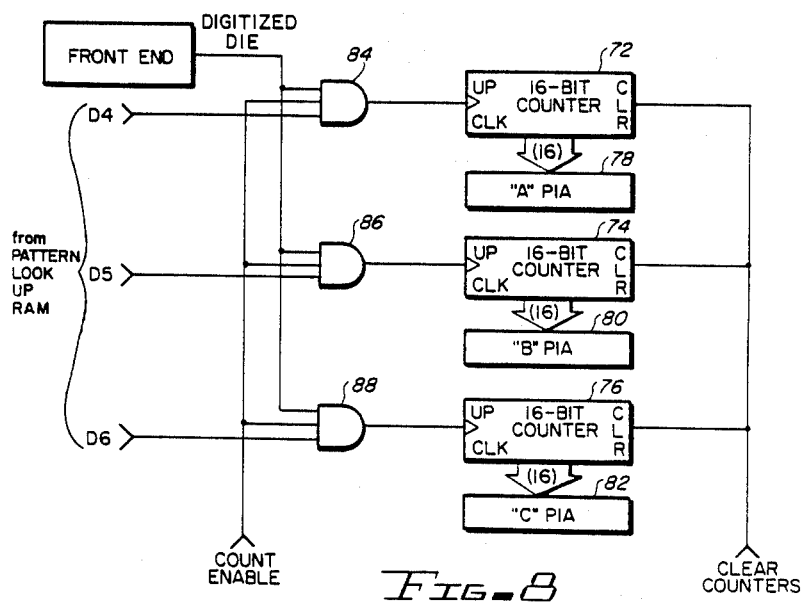

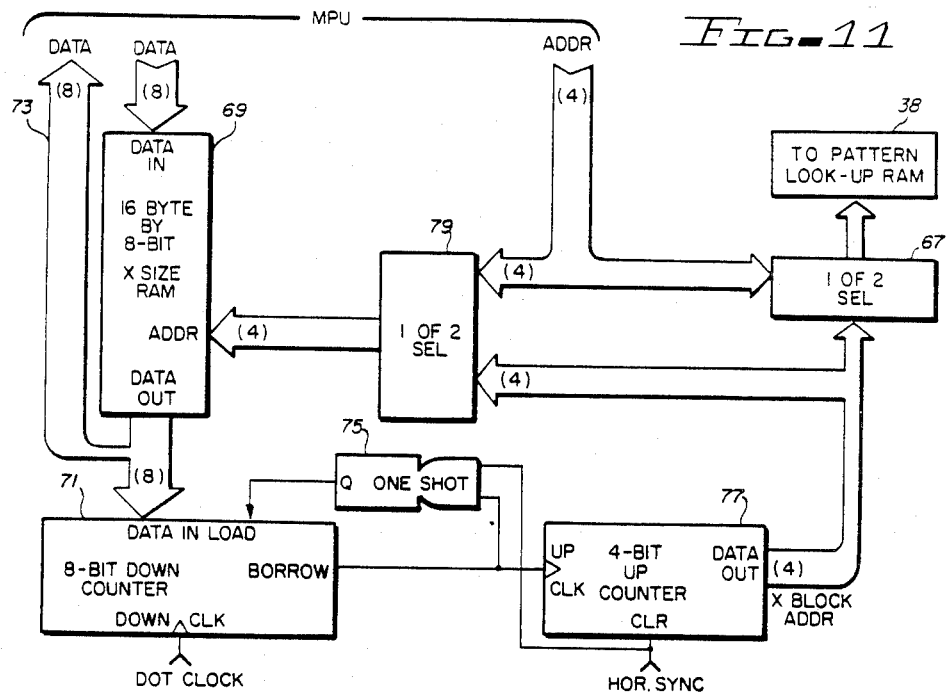
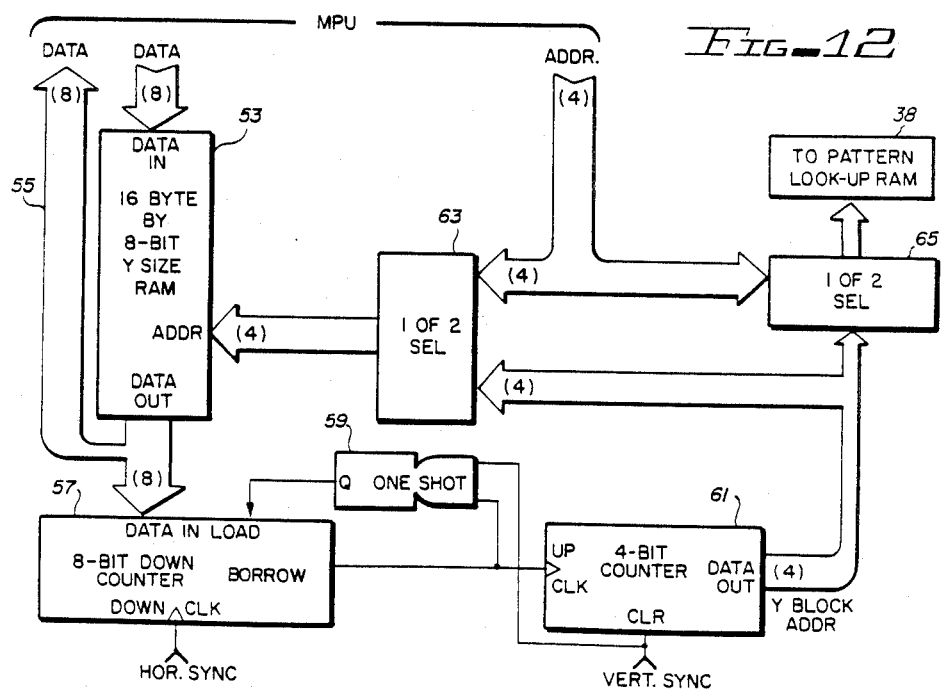

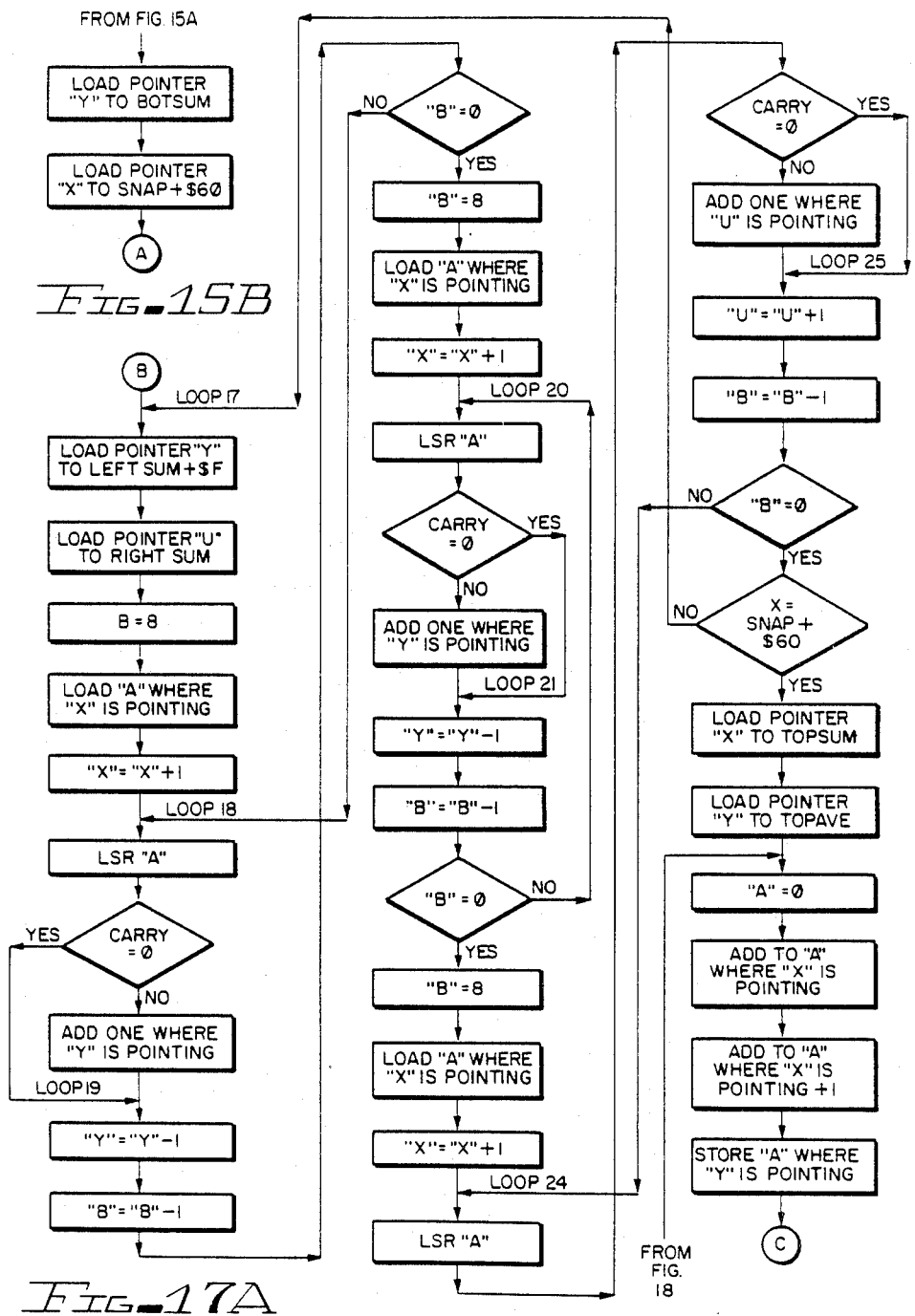

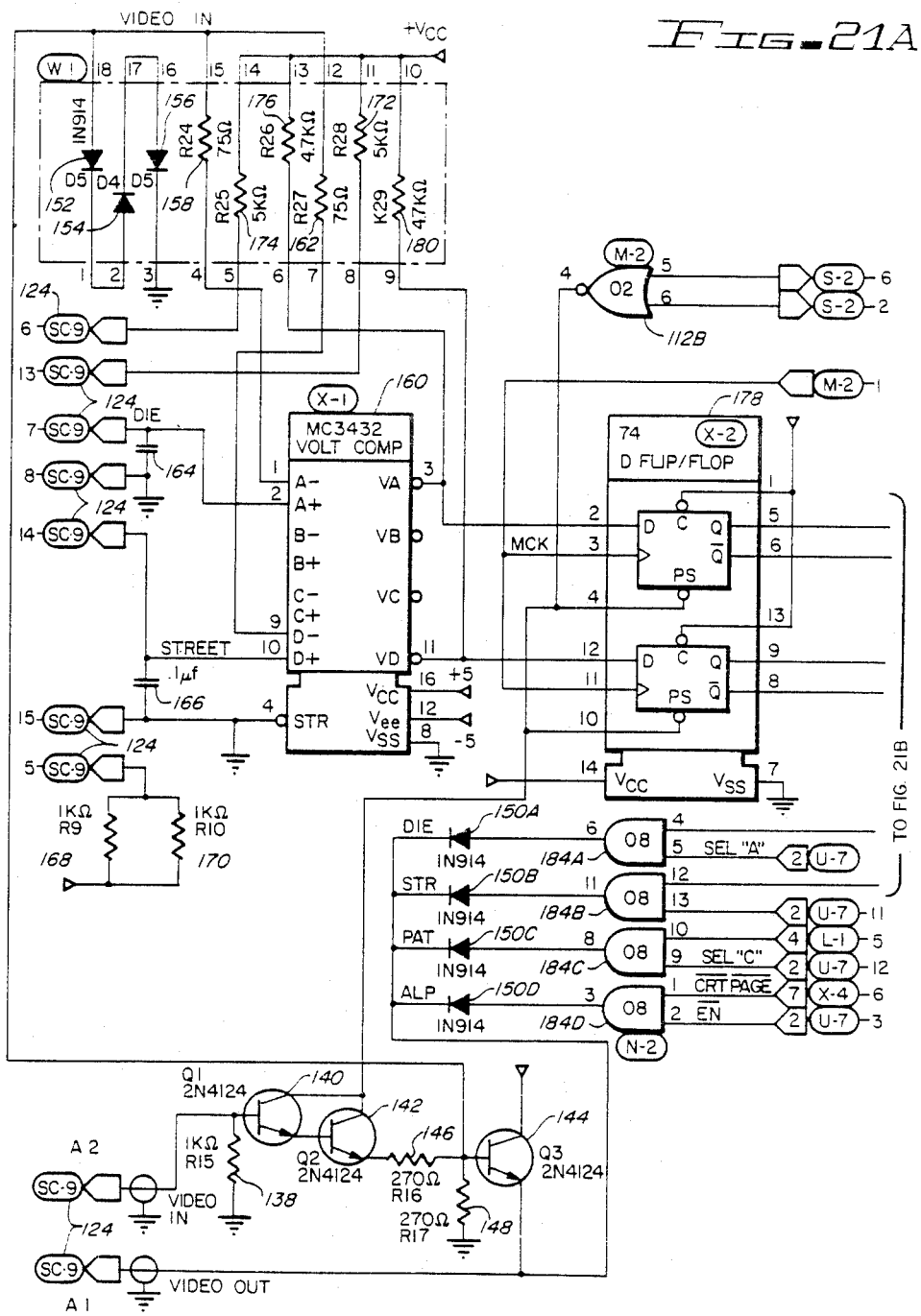

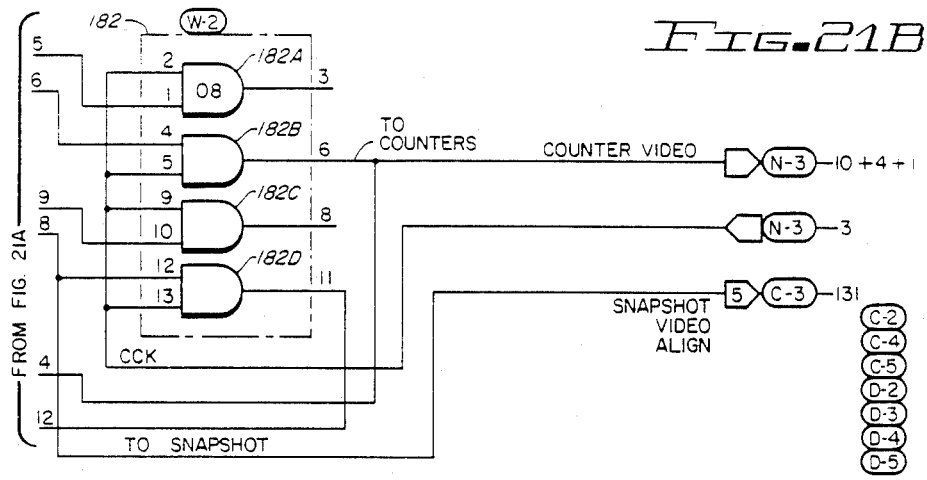
FIG-21B
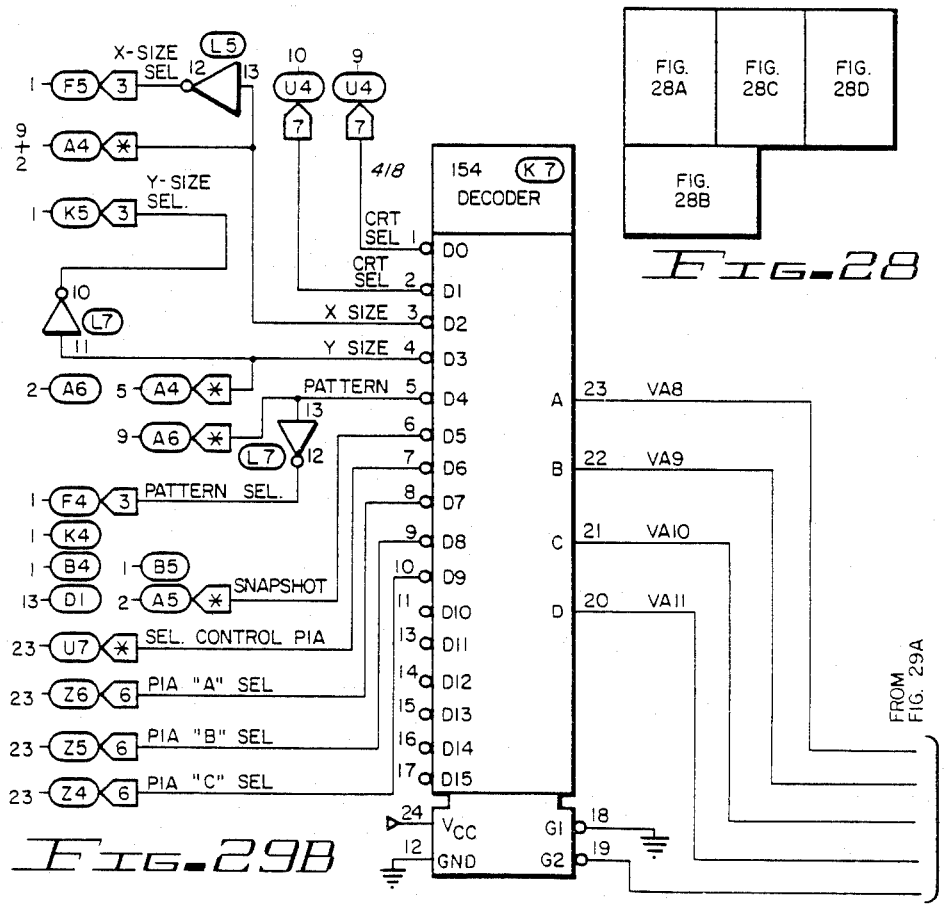
FIG-28
FIG-29B

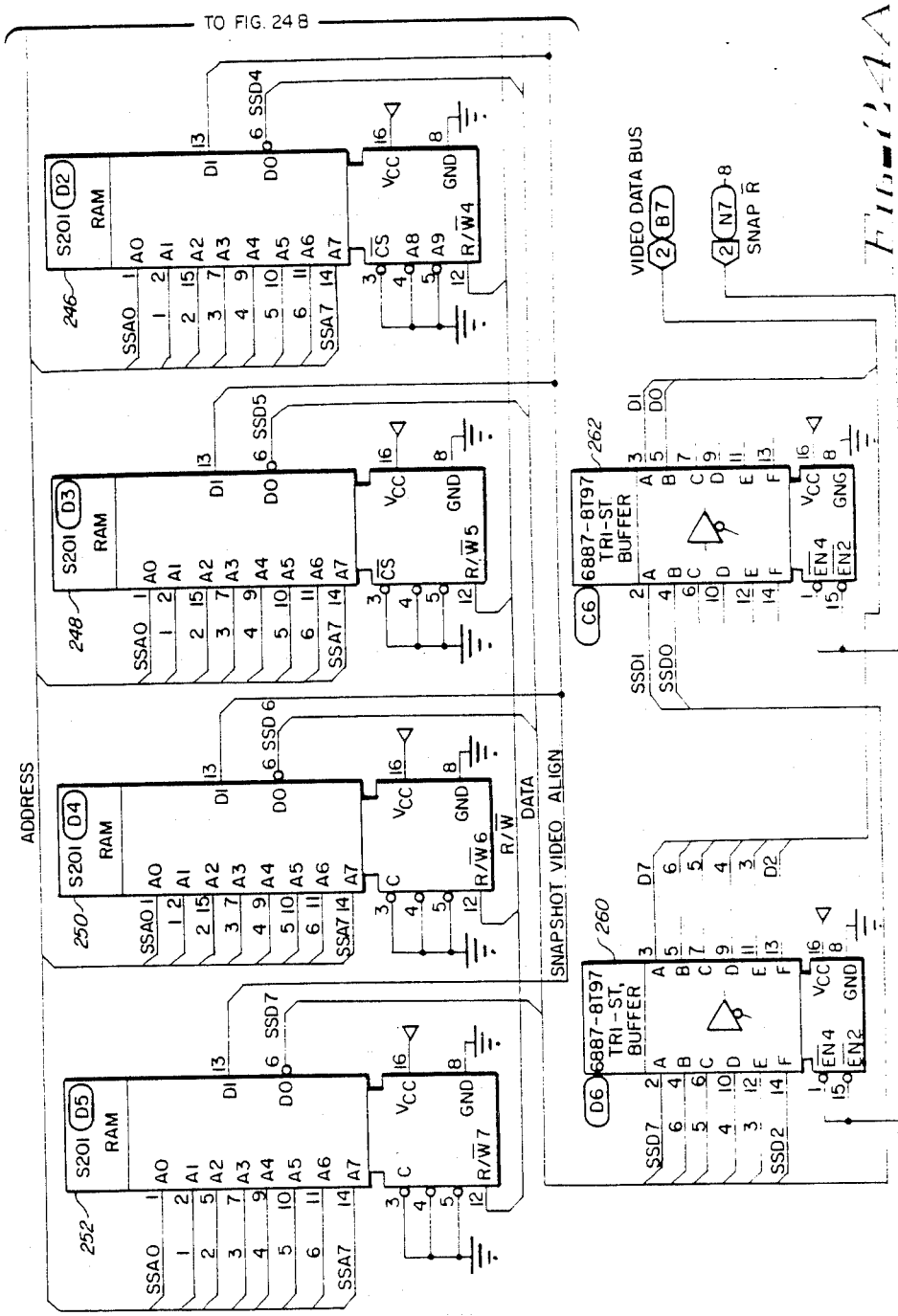

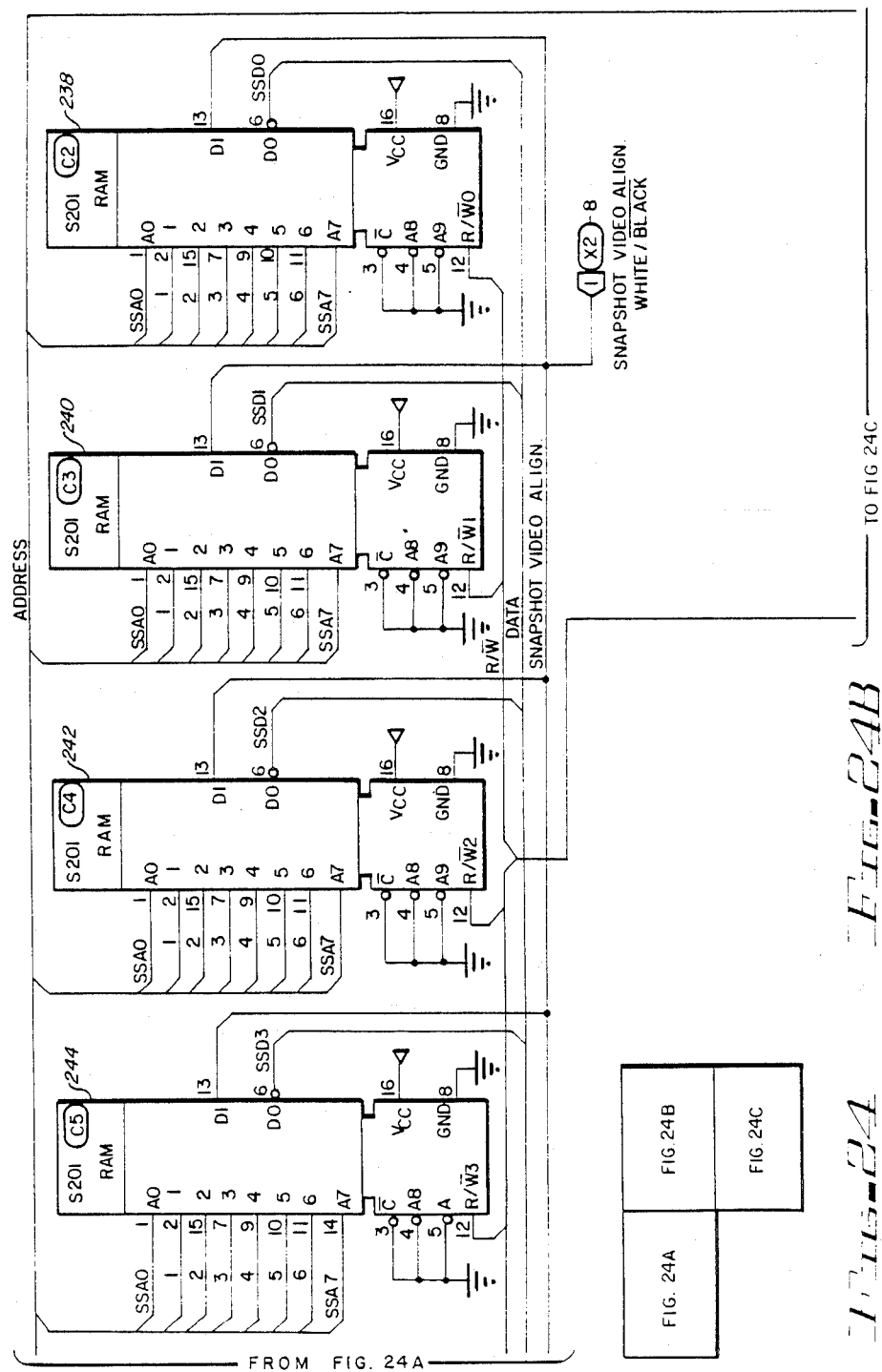

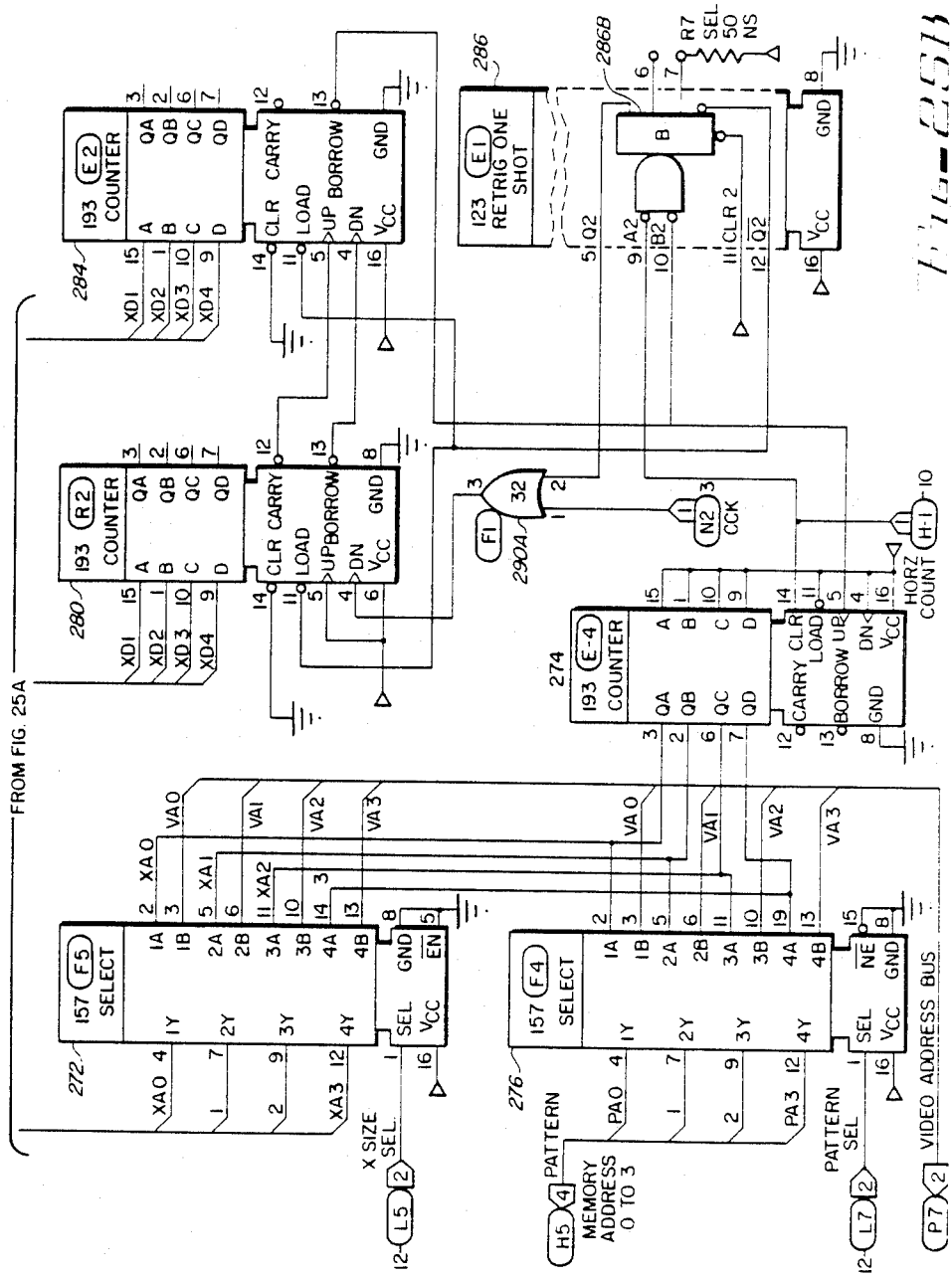

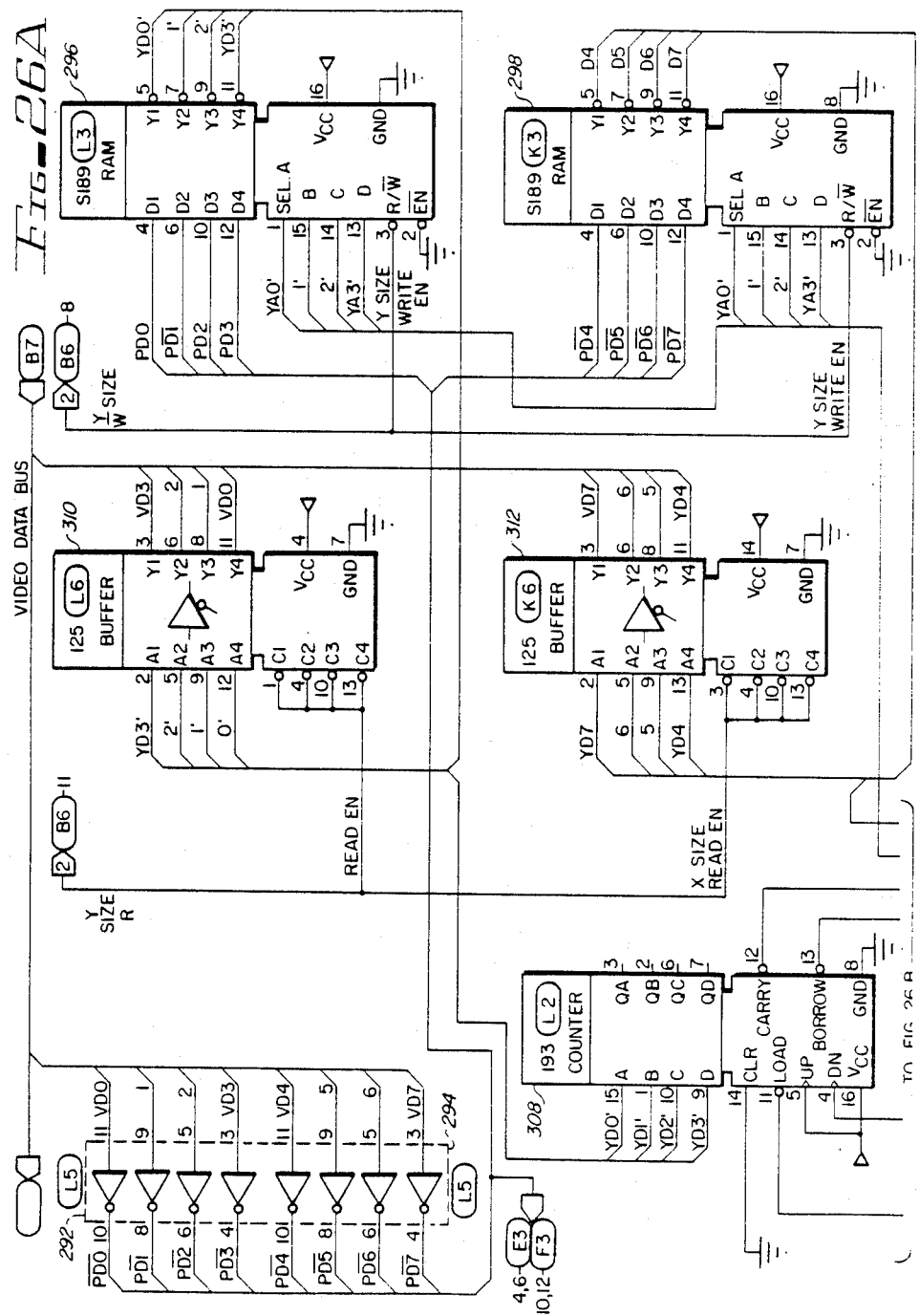

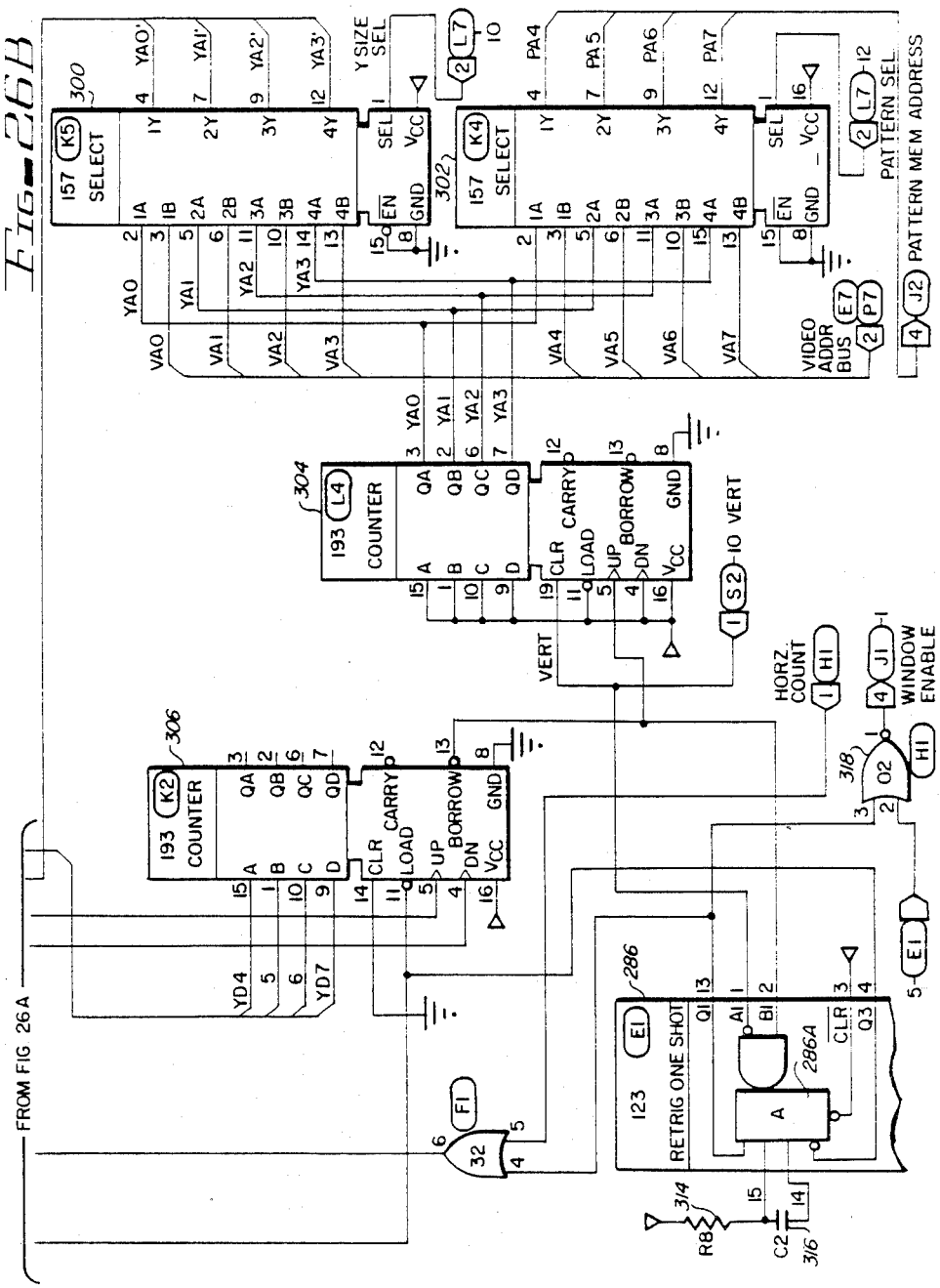

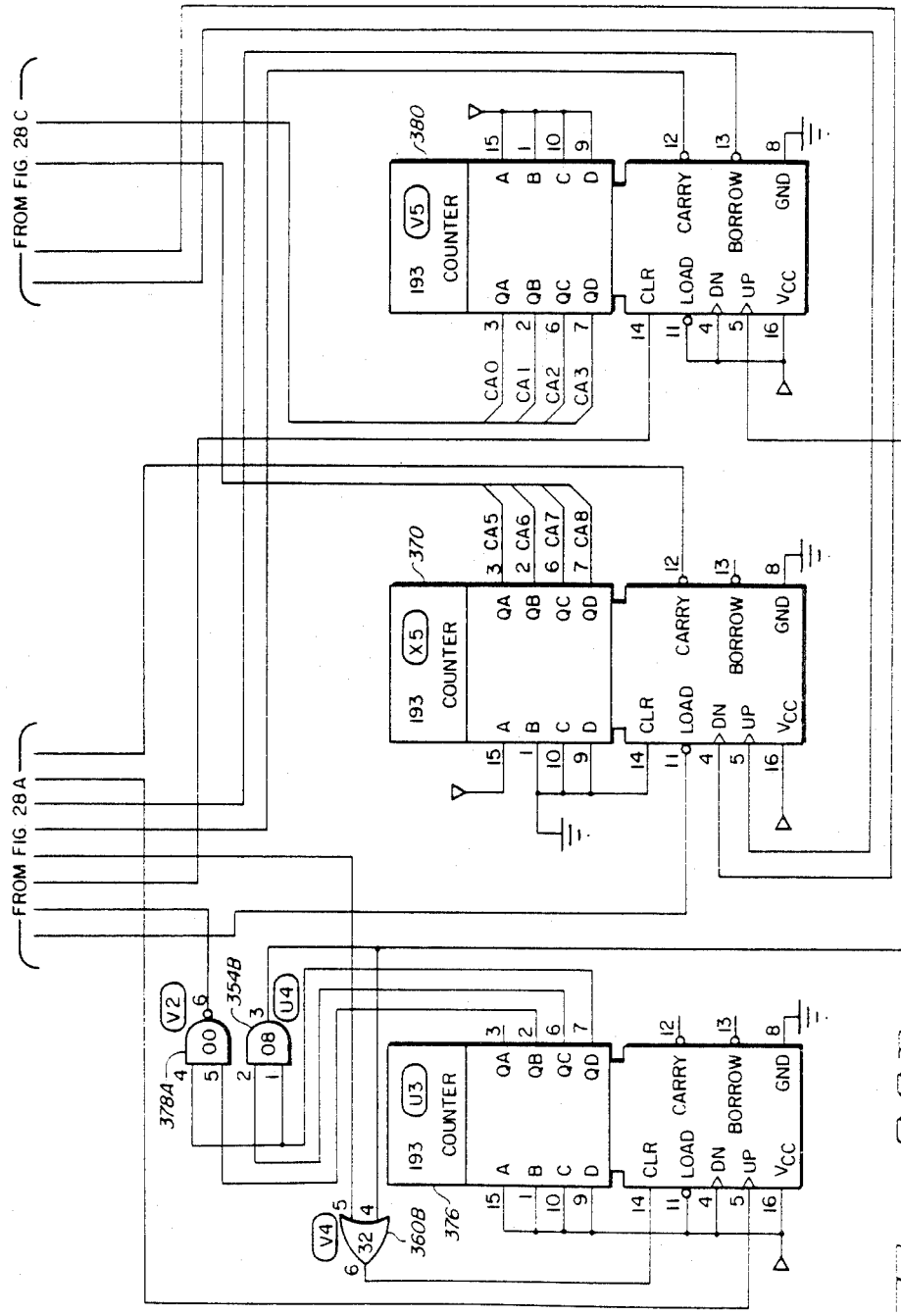

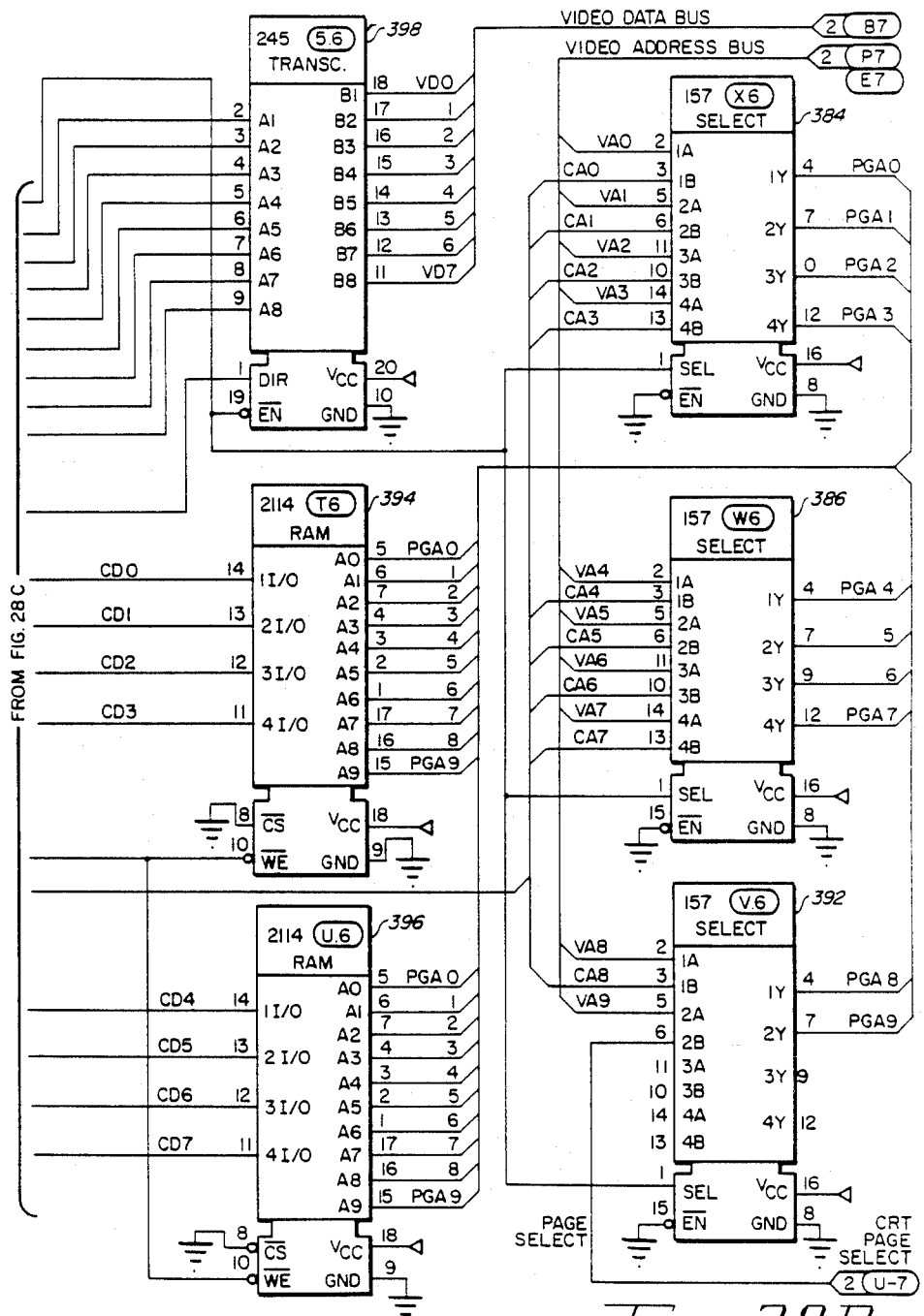

SEMICONDUCTOR TESTING AND APPARATUS THEREFOR

This is a division of application Ser. No. 363,641, filed Mar. 18, 1985, now U.S. Pat. No. 4,520,313.

BACKGROUND OF THE INVENTION

1. Field of the Invention

This invention relates generally to semiconductor testing and, more particularly, to a method and apparatus for evaluating the potential failure of semiconductor chips by digitizing a video scene of only strategic areas on said chip and comparing the resulting pattern with an acceptable pattern stored in memory.

2. Description of the Prior Art

The use of pattern recognition techniques is known in the art of testing semiconductor die. Pattern recognition systems are being used for automatic die inspection in an attempt to locate gross defects in the die. This may be accomplished since the defects can alter a digitized video scene. In some cases, the semiconductor die is scanned and the digitized video signal from a T.V. camera is compared with acceptable stored data.

Unfortunately, to scan an entire die including portions of the scribe areas surrounding the die results in a great deal of data which must be stored and processed. This not only substantially increases the complexity of the test equipment, but also significantly increases test time. The need existed to develop a semiconductor die testing apparatus which would be accurate and have relatively fast test time.

SUMMARY OF THE INVENTION

It is an object of the present invention to provide an improved method for testing semiconductor die.

It is a further object of the present invention to provide a method of testing semiconductor die wherein a video scene of only portions of the die and surrounding scribe areas (or streets) are digitized.

It is a still further object of the present invention to provide a method for testing semiconductor die by digitizing certain regions of the semiconductor die and surrounding scribe areas, said regions being referred to as windows which are programmable so as to change their relative positions and locations.

It is another object of this invention to provide for the simultaneous display on a video screen of alpha numerics, windows or digitized video signals.

It is a final object of the present invention to provide a method for testing semiconductor die by comparing digitized regions or windows of a test die to acceptable data stored in memory.

The above and other objects are achieved by a method of locating and testing a semiconductor die surrounded by a scribe region comprising: scanning preselected regions of said die and said scribe region to generate a video signal corresponding thereto; digitizing said video signal such that white is represented by a first potential and black is represented by a second potential; storing said digitized video signal of said preselected regions; and comparing said stored digitized video signal with a pattern which corresponds to an acceptable semiconductor die.

According to a further aspect of the invention, there is provided an apparatus for testing a semiconductor die surrounded by a scribe region, comprising: first means for scanning preselected regions of said die and said scribe regions to generate a digital video signal corresponding thereto; memory means for storing said digitized video signal; and second means for comparing said stored digitized video signal to a digital pattern which corresponds to an acceptable die.

The above and other objects, features and advantages of the present invention will be more clearly understood from the following detailed description taken in conjunction with the accompanying drawings, in which:

BRIEF DESCRIPTION OF THE DRAWINGS

FIG. 3 illustrates data generated from the scanned and digitized windows;

FIG. 5 is a block diagram of the FRONT END shown in FIG. 4;

FIG. 6 illustrates the contents of the ARMING block shown in FIG. 4;

FIG. 7 is a timing diagram illustrating the operation of the circuitry shown in FIG. 6;

FIG. 8 illustrates in detail the COUNTER block shown in FIG. 4.

FIG. 11 illustrates the X-SIZE BLOCK GENERATOR shown in FIG. 4;

FIG. 12 is a block diagram of the Y-SIZE BLOCK GENERATOR shown in FIG. 4;

FIGS. 15-19 are a flow chart of the CRUNCH subroutine.

FIG. 21 is a diagram of a circuit which functions as the FRONT END shown in FIG. 5.

CIRCUIT OPERATION

Figure 1:
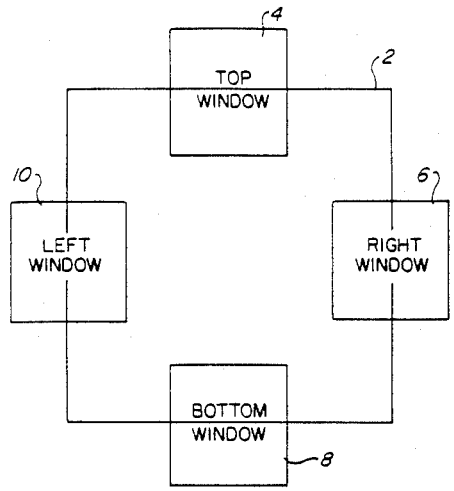
FIG. 1 illustrates a semiconductor die and four strategic windows of comparison.

FIG. 1 illustrates a semiconductor die 2 which is only one of many on a semiconductor wafer. The region immediately surrounding semiconductor die 2 corresponds to a scribe or street area. As can be seen, four windows partly overlap the semiconductor die. These are top window 4, right window 6, bottom window 8, and left window 10. It is only in the window areas that digitized data is stored in memory in order to determine the chip edges.

Figure 2:
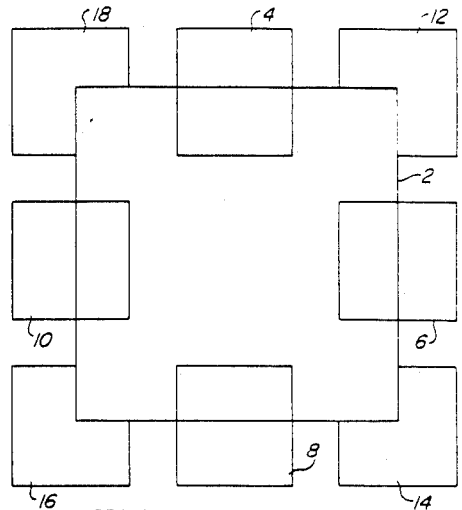
FIG. 2 illustrates an alternate pattern of windows.

FIG. 2 illustrates the same semiconductor die 2 which is analyzed using the top, right, bottom and left windows 4, 6, 8, and 10, respectively, shown in FIG. 1 plus additional regions of analysis corresponding to an upper right-hand corner region 12, a lower right-hand corner region 14, a lower left-hand corner region 16 and an upper left-hand corner region 18.

Referring again to FIG. 1, each of the windows are scanned and digitized in order to generate data corresponding to light and dark spaces on the chip. The data is converted to digital form and may appear as is shown in FIG. 3 wherein the upper group of data corresponds to window 4, the right-hand group of data corresponds to window 6, the lower group of data corresponds to window 8 and the leftmost group of data corresponds to window 10. This data is then used to locate the die edge (or streets).

Figure 4:
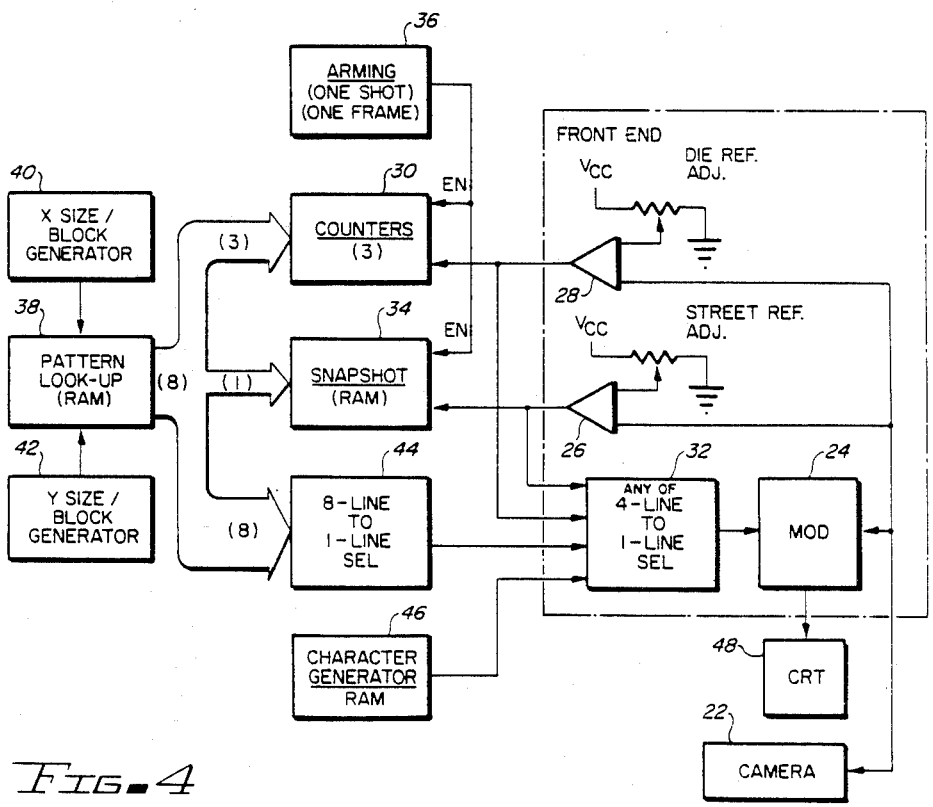
FIG. 4 is a block diagram of a video interface structure to couple a video camera to a software or hardware unit.

FIG. 4 is a block diagram of a video interface structure necessary for carrying out the inventive scanning process. As can be seen, a video camera 22 has an output coupled to a modulator 24 and to a first input of a street comparator 26 and a die comparator 28. A second input of the street comparator 26 is coupled to a street reference adjust mechanism which is adjusted so that a maximum of white dots are detected leaving the streets or scribe areas black. This is to be done so as to enable the edges to be seen by the MPU thru the SNAPSHOT RAM circuit 34. A second input of the die comparator 28 is coupled to a die reference adjust mechanism which will pass data corresponding to ink dots and scratches as black and ignore the streets. These adjustments are significant because these references are used by a central processing unit check to see if the die is acceptable. The output of the die comparator 28 is coupled to one input of a COUNTER block 30 and to a first input of an any of four-to-one select block 32. The output of the street comparator 26 is coupled to a first input of the SNAPSHOT RAM circuit 34 and to a second input of the any of four-to-one select block 32. An ARMING unit 36 generates an ENABLE signal which is applied to a second input of the COUNTER block 30 and to a second input of the SNAPSHOT RAM circuitry 34. A PATTERN LOOK-UP RAM circuit 38 has a first input coupled to a X-SIZE block generator 40 and a second input coupled to a Y-SIZE block generator 42. The output of the PATTERN LOOK-UP RAM circuit 38 is coupled to the COUNTER block 30, the SNAPSHOT RAM circuit 34, and to an eight-to-one select block 44 as shown. An output of the eight-to-one select block 44 is coupled to a third input of the any of four-to-one select block 32. A fourth input of the any of four-to-one select block 32 corresponds to an output of a CHARACTER GENERATOR RAM circuit 46. An output of the any of four-to-one select block 32 is coupled to a second input modulator 24 an output of which is applied to a CRT 48.

The any of four-to-one select block 42 permits the visual display of certain data. The street reference comparator 26, in effect, acts as an edge detector which is used with the window patterns 12, 14, 16 and 18 and the SNAPSHOT RAM circuit 34 for centering or alignment of the die. Finally, the die reference comparator 28 is used to detect defects in the die. The output of the street comparator, die comparator, eight-to-one pattern select block or the character generator may be displayed on CRT 48 as white dots.

FIG. 5 is a block diagram illustrating, in greater detail, that portion of the system shown in FIG. 4 and labeled FRONT END. A VIDEO IN signal is amplified, and clamped by input circuit 64, and then applied to the street and die comparators 26 and 28, respectively. The output of the comparators 26 and 28 are applied to the D inputs of flip flops 52 and 54, respectively, each having a Q output applied to one input of NAND gates 56 and 58, respectively. The second input of NAND gates 56 and 58 are coupled to a clock pulse applied through the flip flops 52 and 54. The multiple select 32 selects any combination of the output of NAND gate 58, NAND gate 56, character generator 46, and of pattern generator 60 for transmission, under the control of a select signal from the MPU peripheral interface adapter, as a VIDEO OUT signal. Comparators 26 and 28 may be of a type commercially available from Motorola, Inc. and bearing part No. MC3432.

FIG. 6 illustrates, in more detail, contents of the ARMING block 36 shown in FIG. 4. As can be seen, a START-OF-COUNT signal from the MPU peripheral interface adapters is applied to the input of a series of two inverters 64 and 70. The output of inverter 70 represents a CLEAR signal to JK flip flops 66 and 68. The J input of flip flop 66 is tied to a positive source of supply voltage Vcc while the K input is grounded. The Q output of flip flop 66 is coupled to the K input of flip flop 68 while the Q output of flip flop 66 is coupled to the J input of flip/flop 68. Both flip flops 66 and 68 have their clock inputs coupled to a vertical pulse, VERT. The output of inverter 64 also represents a CLEAR COUNTERS signal for clearing COUNTER block 30. The Q output of flip flop 68 represents a COUNT ENABLE signal which is applied to both the COUNTER block 30 and the SNAPSHOT RAM 34. The Q output of flip flop 68 represents an END-OF-COUNT signal which is forwarded to the MPU. The ARMING circuit 36 represents synchronous one shot which generates an enabled signal for loading the SNAPSHOT RAM circuit 34 and the COUNTER block 30. Clearing the flip-flops also clears the COUNTER block 30. Releasing the clear will allow the next vertical SYNC pulse to enable the SNAPSHOT RAM and COUNTER circuits. The second vertical SYNC pulse will turn off the enable and set a flag in the peripheral interface adapter to signal the MPU that it can go in and look at digitized data stored in the SNAPSHOT RAM 34. This accomplishes a comparison between the acceptable data in the memory of the CPU and the digitized data in the SNAPSHOT RAM circuit 34 to fine the edges of a die FIG. 7 is a timing diagram illustrating the operation of the circuitry shown in FIG. 6. The first line represents a CLEAR pulse while the last line represents the vertical SYNC pulses. The second and third lines represents the Q and $\overline{Q}$ outputs of flip flop 66 while the sixth and seventh lines indicate the Q and $\overline{Q}$ outputs of flip flop 68. The fourth and fifth lines represent the J and K inputs of flip flops 68.

FIG. 8 is a block diagram illustrating, in greater detail, the COUNTER block 30 shown in FIG. 4. Three 16-bit counters 72, 74, and 76 feed, respectively, peripheral interface adapters 78, 80, and 82. The CLEAR COUNTERS signal from the ARMING circuit 46 is applied to the clear input of each of the counters. Each of the counters 72, 74, and 76 have an up clock input which is coupled, respectively, to the output of AND gates 84, 86, and 88. A COUNT ENABLE signal from the ARMING circuit is applied to the first input of each of the AND gates. The digitized signal from the FRONT END, which corresponds to the output of the DIE comparator 28 shown in FIG. 4, is applied to the second input of each of the AND gates. The third inputs of AND gates 84, 86, and 88 are coupled, respectively, to data signals D4, D5, and D6 from PATTERN LOOK-UP RAM 38 (FIG. 4). Each of the counters are cleared when the ARMING circuit is set up to be triggered. When the COUNT ENABLE signal from the ARMING circuit and a pattern bit (N) are true, the counter will count the number of "white" dots from the digitized "DIE" signal in the pattern for one frame. At the end of that frame, the counters are disabled. The signal from the FRONT END applied to inputs of AND gates 84, 86, and 88 corresponds to the digitized die and comprises all logical ones or zeros.

Figure 9:
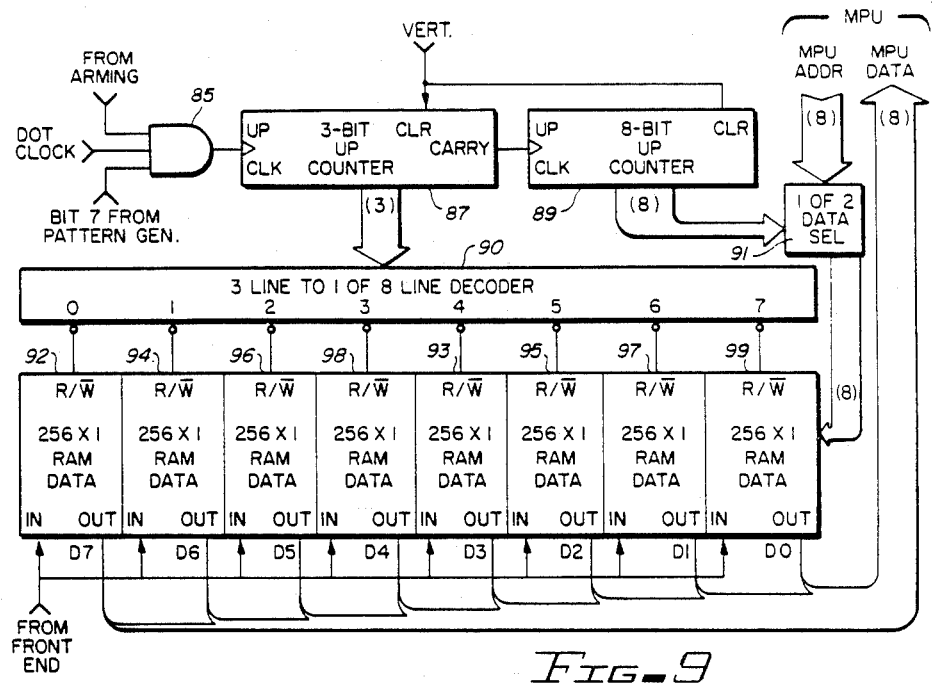
FIG. 9 is a more detailed diagram of the SNAPSHOT RAM circuit shown in FIG. 4.

FIG. 9 is a more detailed block diagram of the SNAPSHOT RAM circuit 34 shown in FIG. A. As can be seen, a three-to-one of eight line decoder has outputs coupled to a plurality of 256 X 1 RAMS 92 through 99. The outputs of the three-to-one of eight line decoder 90 are coupled to the R/W inputs of the RAMS. Each of the RAMS receives digitized data from the front end and transmits data bits D0, D1, D2, D3, D4, D5, D6, and D7 to the MPU. Bit 7 from the pattern generator, an ENABLE signal from the ARMING circuit and a DOT clock are applied to first, second and third inputs of AND gate 85 which, in turn, has an output coupled to the up clock input of a 3-bit up counter 87. Counter 87 has a carry output which is coupled to the up clock input of an 8-bit up counter 89. Both counters 87 and 89 are coupled to be cleared by the vertical SYNC pulse $\overline{VERT}$. A three line output from counter 87 is applied to the input of the three-to-one of eight line decoder 90. The output of 8-bit up counter 89 is applied to a first input of one-of-two data select 91, the second input of which is buffered and coupled to an address line from the MPU. The output of one-of-two data select 85 is applied as an eight line address to the input of RAMS 92, 94, 96, 98, 99, 97, 95, and 93.

As stated previously, the vertical SYNC pulse $\overline{VERT}$ will clear the three-bit up counters 89 and 87. When the ARMING circuit has been triggered, the ENABLE signal will cause the SNAPSHOT RAM 34 to load. When enabled, the DOT clock and bit 7 from the pattern generator are high, the 3-bit counter increments and writes 1 bit of video into snapshot memory. When 8 bits have been written, the carry increment will increment the up counter by one and allow the next 8 bits to be written. So when bit 7 of the pattern generator is on (a logical one), a video "street" is gated into the snapshot. This permits the MPU to see a part of the picture and check if the pattern is in a street or not.

Figure 10:
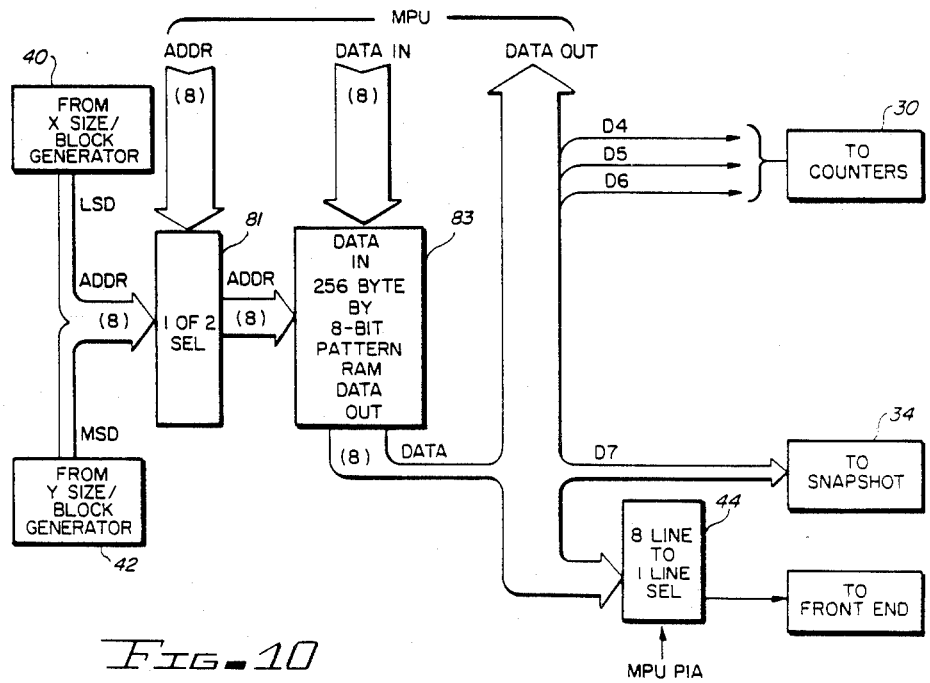
FIG. 10 illustrates the PATTERN LOOK UP RAM circuit of FIG. 4 in greater detail.

The PATTERN LOOK-UP RAM 38 of FIG. 4 is shown in more detail in FIG. 10. A 4-bit address from the X-SIZE block generator 40 and a 4-bit address from the Y-SIZE block generator 42 form an 8-bit address which is applied to a one-of-two select which also has an 8-bit address from the MPU applied thereto. The output of select 81 is an eight-line address which is applied to a 256 byte by 8-bit pattern RAM 83. Eight data lines from the MPU are applied to data inputs of RAM 83, and eight data lines are output. Of course, D4, D5, and D6 are applied to COUNTER block 30 (as shown in FIG. 8), D7 is applied to the SNAPSHOT RAM 34 (as shown in FIG. 9), and eight lines are applied to the eight-to-one line select 44 whose output is coupled to the FRONT END as shown in FIG. 4.

As can be seen, data from the X block 40 and the Y block 42 are combined to form an address, or an X-Y position, starting at the top left corner of the CRT. The X block is the least significant digit and the Y block is the most significant digit of a hex address. There is a maximum of 256 blocks on the CRT. The data (8 bits) at a given address or X-Y position in the PATTERN LOOK-UP RAM 38 will determine eight patterns, one pattern per bit. A logical zero means pattern off and a logical one means pattern on. These bits or patterns are used to gate or enable the COUNTER block 30 and the SNAPSHOT RAM 34. Any of the patterns can be selected to be displayed on the CRT. By adjusting the X block 0 to a larger size (i.e. more dots), blocks 1, 2, 3, etc. will be pushed over by the same number of dots. Adding more dots to X block 0 will move the pattern to the right without changing its size or shape.

FIG. 11 is a more detailed diagram of the X-SIZE block generator 40 shown in FIG. 4. The 8-line data from the MPU is supplied to an X-SIZE RAM 69 whose "data out" is applied to the "data in" input of an 8-bit down counter 71. A 6.6 megacycle dot clock is applied to the down clock input of counter 71. The of the X-SIZE RAM 69 is also applied back to the MPU via data lines 73. Down counter 71 is loaded as a result of a one shot 75 which has a first input coupled to a horizontal SYNC pulse and a second input to the borrow output of counter 71. The borrow output of counter 71 and horizontal SYNC pulse are also applied to the up clock and clear inputs of a 4-bit up counter 77 the output of which corresponds to the X block address which is applied to one-of-two select 79 and to the one-of-two select 67. The one-of-two selects 67 and 79 also receive a four-line address from the MPU. The output of the one-of-two select 79 is applied back to X-SIZE RAM 69. The output of the one-of-two select 67 is applied to the PATTERN LOOK-UP RAM 38.

As stated previously, the horizontal SYNC pulse goes to the 4-bit up counter 77 and to the one shot 75. The up counter 77 is cleared and its data is routed through the one-of-two select 79 into the address of the X-SIZE RAM 69. The data from the X-SIZE RAM 69 is loaded into 8-bit counter 71 because the one shot 75 has not yet timed out. When the one shot times out, the dot clock counts down the number that was loaded into down counter 71. After the 8-bit down counter 71 counts to zero, a borrow pulse fires one shot 75 which loads the 8-bit counter 71 at a new address because the 4-bit counter 77 has been incremented by one.

Thus, each block size is determined by the X-SIZE RAM 69 which will define a number of dots (or vertical lines) in a block before going onto the next block. Each horizontal line is, therefore, chopped into a maximum of 16 blocks (the size of the X-SIZE RAM 69). Each block (or address) is programmable in size prior to the horizontal SYNC signal resetting the 4-bit counter 77 back to zero, corresponding to the left side of the CRT.

FIG. 12 is a block diagram of the Y-SIZE block generator 42 shown in FIG. 4. It is very similar to the X-SIZE block generator in that data from the microprocessor is applied to the data input of a Y-SIZE RAM 53. Data from the Y-SIZE RAM 53 is applied back to the MPU over line 55 and to the "data in" input of an 8 bit down counter 57 which is clocked by a horizontal SYNC pulse and which is loaded by the output of a one shot 59. The output of down counter 57 triggers the one shot 59 and increments a 4-bit up counter 61. The vertical SYNC pulse is applied to the one shot 59 and utilized to clear the 4-bit up counter 61. Data from the 4-bit up counter 61 is applied to the inputs of one-of-two select 63 and one-of-two select 65. A 4-line address from the MPU is also applied to the selects 63 and 65. The output of the one-of-two select 63 is applied to the address input of Y-SIZE RAM 53. The output of the one-of-two select 65 is applied to the PATTERN LOOK-UP RAM 38.

The Y-SIZE block generator works in the same way as the X-SIZE block generator except for the fact that the 8-bit counter 57 counts lines (horizontal) and the Y block 4-bit counter 61 is reset by the vertical SYNC pulse. This will chop the vertical frame into a maximum of 16 blocks. Each block (or address) is programmable in size (the number of horizontal lines in each block) prior to the vertical SYNC resetting the Y block 4-bit counter 61 back to zero, corresponding to the top of the CRT.

Figure 13:
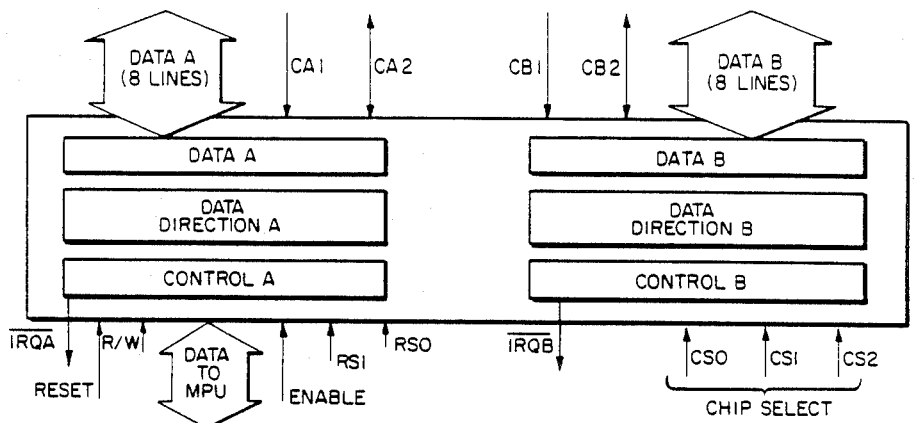
FIG. 13 is a block diagram of the peripheral interface adaptor.
Figure 16:
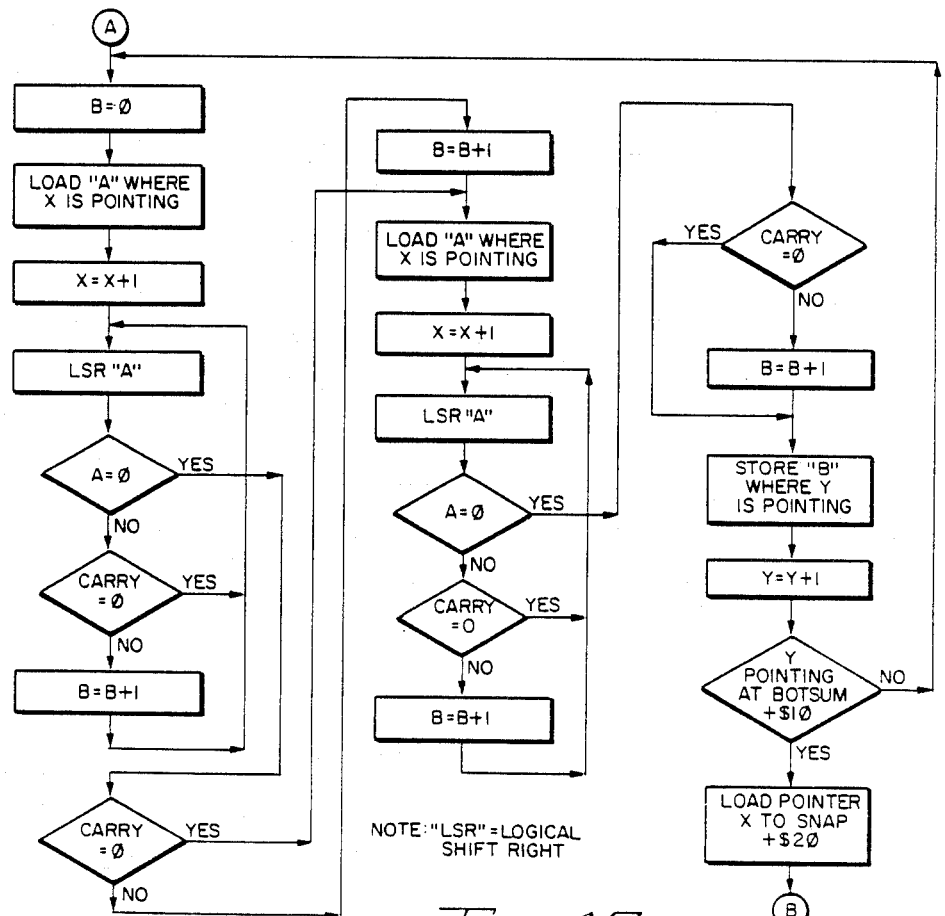

A peripheral interface adapter (PIA) shown in FIG. 13 is an input/output (I/O) device (MC6821) which is used to interface peripheral equipment with a microprocessor unit (MPU). The PIA communicates with the MPU by means of eight-bit bi-directional peripheral data busses, three chip selects, two register selects, two interrupt request lines, one read/write line, an enable line and a reset line. Both data A and data B may be programmed to act as input or output data lines. Each PIA contains two control registers, two data direction registers, and two peripheral interface registers. The control and data direction registers are used to control the data in and out of the PIA.

Figure 14:
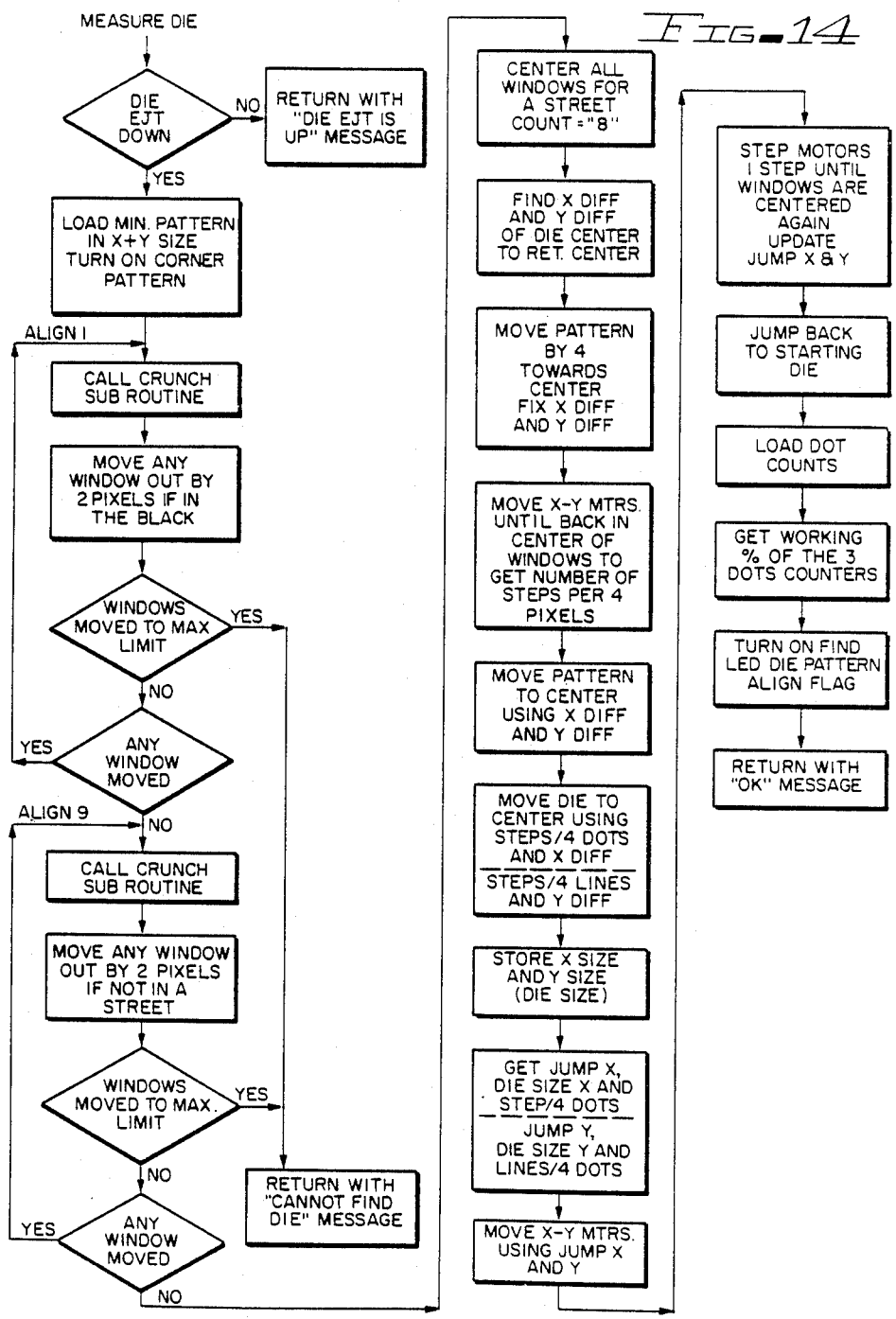
FIG. 14 is a flow chart of the MEASURE DIE process.
Figure 15A:
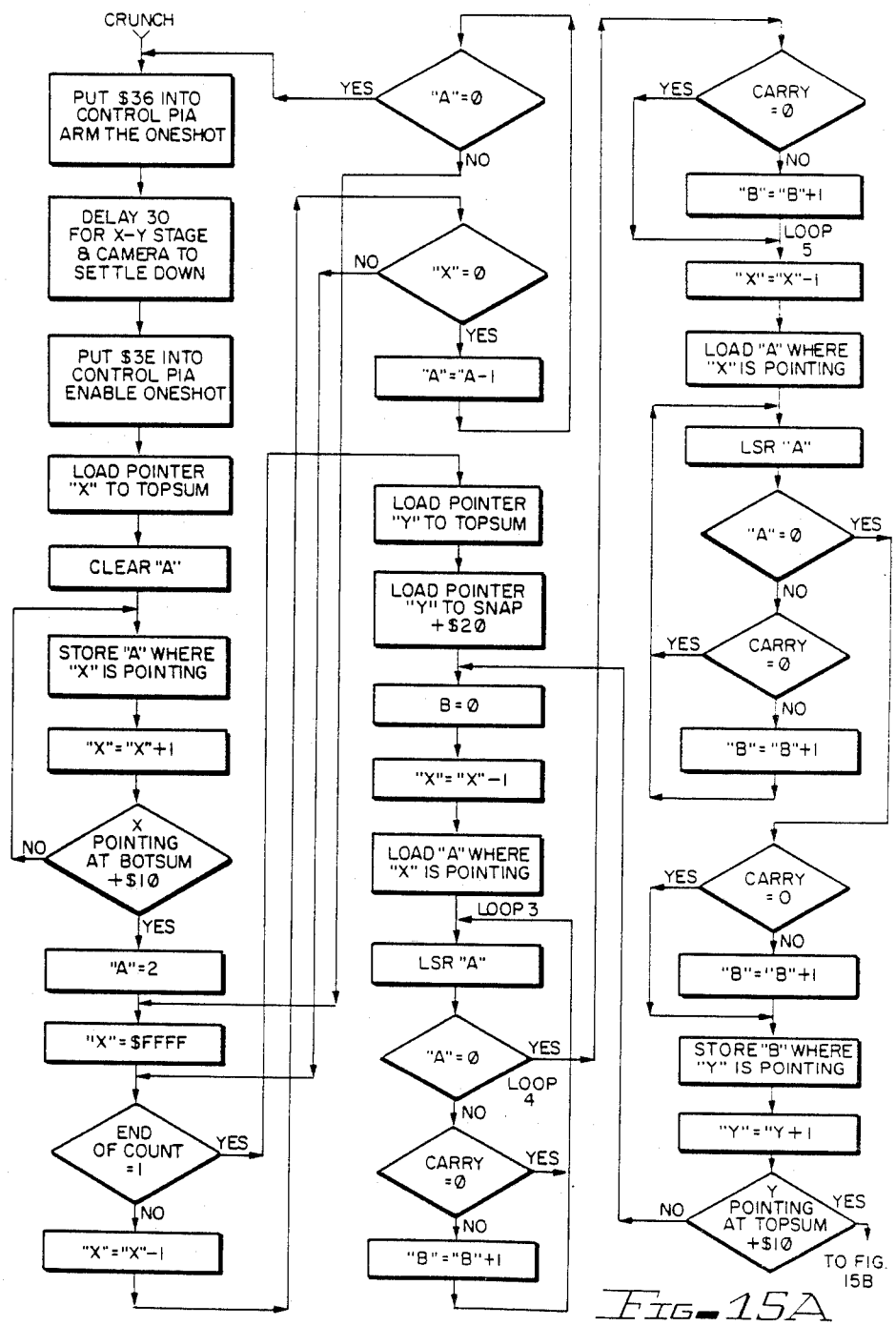
Figure 18:
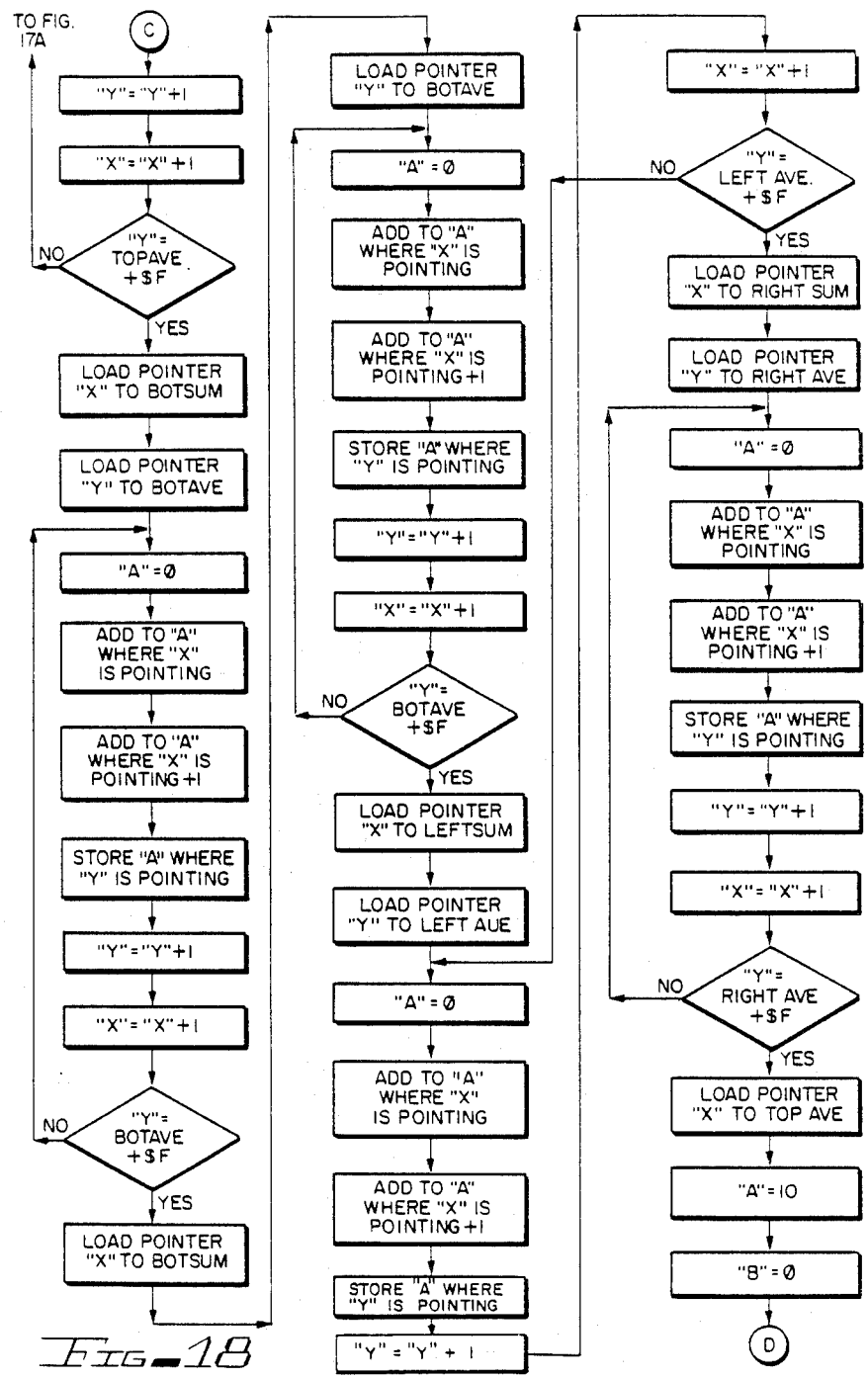
Figure 19:
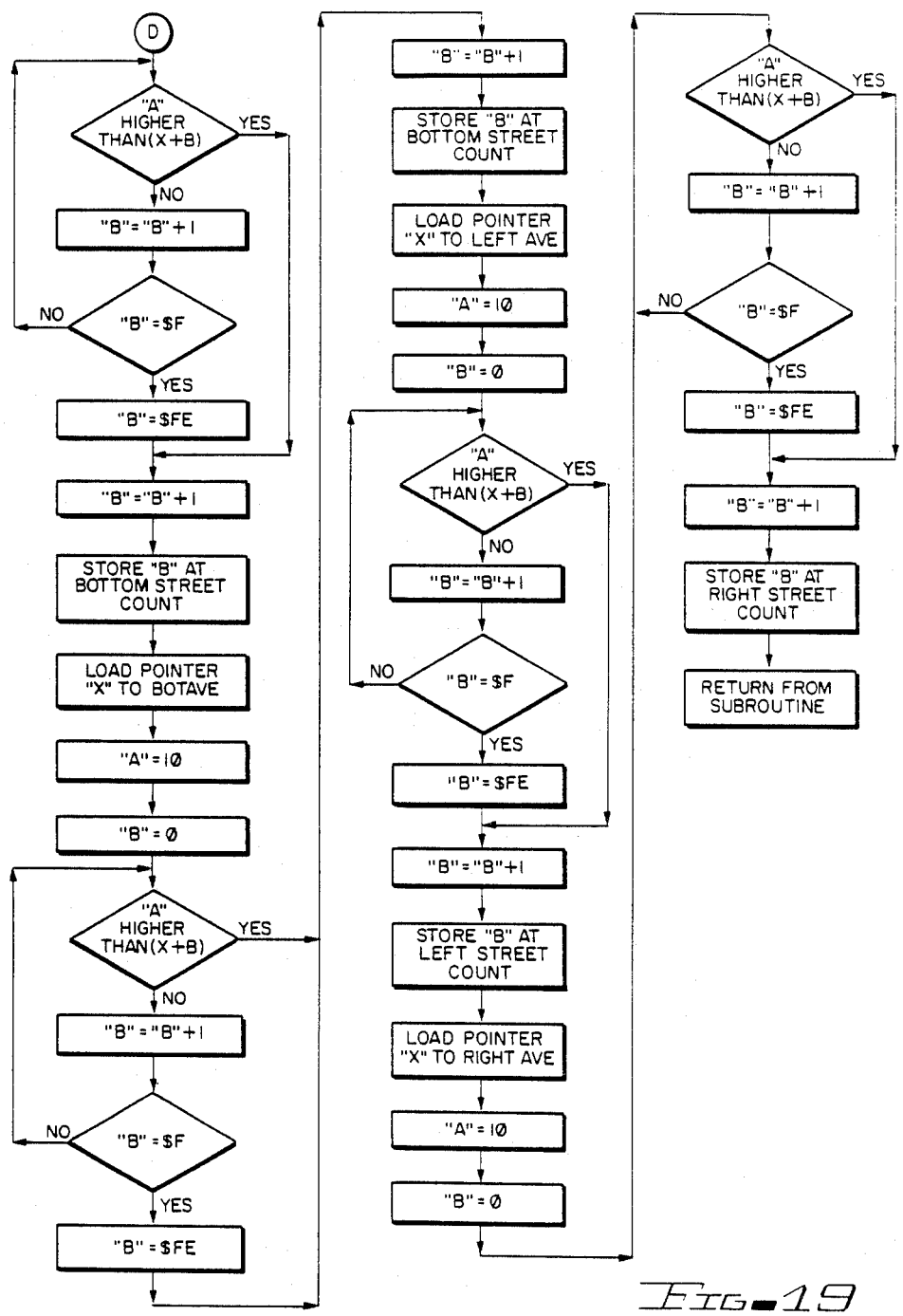

To measure a die, an operator moves an X-Y stage to find a good die more or less centered to the corner pattern described previously. With the "street adj" and the "die adj" adjusted, the operator goes into a "MEASURE DIE" mode. This subroutine is described by the flow chart shown in FIG. 14. A subroutine referred to as "CRUNCH", shown in FIGS. 15A through 19, performs the following. The MPU outputs a low to the "START OF COUNT" in the ARMING circuit 36 which gets the one shot ready and clears the COUNTER block 30. The SNAPSHOT RAM 34 and the COUNTER block 30 are then loaded. Assume that a "0" is black and a "1" is white. Starting at the bottom horizontal line of the top window 4, the number of 1's is summed and stored in the TOPSUM+0 table. This process continues towards the top of the window line by line with the results being stored in TOPSUM+1, TOPSUM+2, etc. The same process is performed with respect to the bottom window 8 except that the process starts at the top horizontal line of the bottom window and the sums are stored in the BOTSOM table. The left and right windows 10 and 6, respectively, are rotated 90 degrees, the number of 1's in each vertical line is counted, and the results stored in LEFTSUM and RIGHTSUM, respectively. Next, a sliding average is done on the four sum tables top, bottom, left and right. If an average count of less than a first predetermined number is found, it represents a street, and the number of rows (into sum tables TOPSUM and LEFTSUM) and number of columns (into sum tables LEFTSUM and RIGHTSUM) is stored into a "street count" table. If the average count is greater than the predetermined number, a negative number is stored meaning that the window is in the white (a die) and no edge has been found. There are four street count tables; i.e. top street count (TOPSTC), bottom stress count (BOTSTC), left street count (LFTSK), and right street, count (RHTSTC). The "MEASURE DIE" and "CRUNCH" subroutines are included in the source code listing shown in Appendix A of U.S. Pat. No. 4,520,313 which is incorporated herein by reference.

DETAILED CIRCUIT DESCRIPTION

Figure 20:
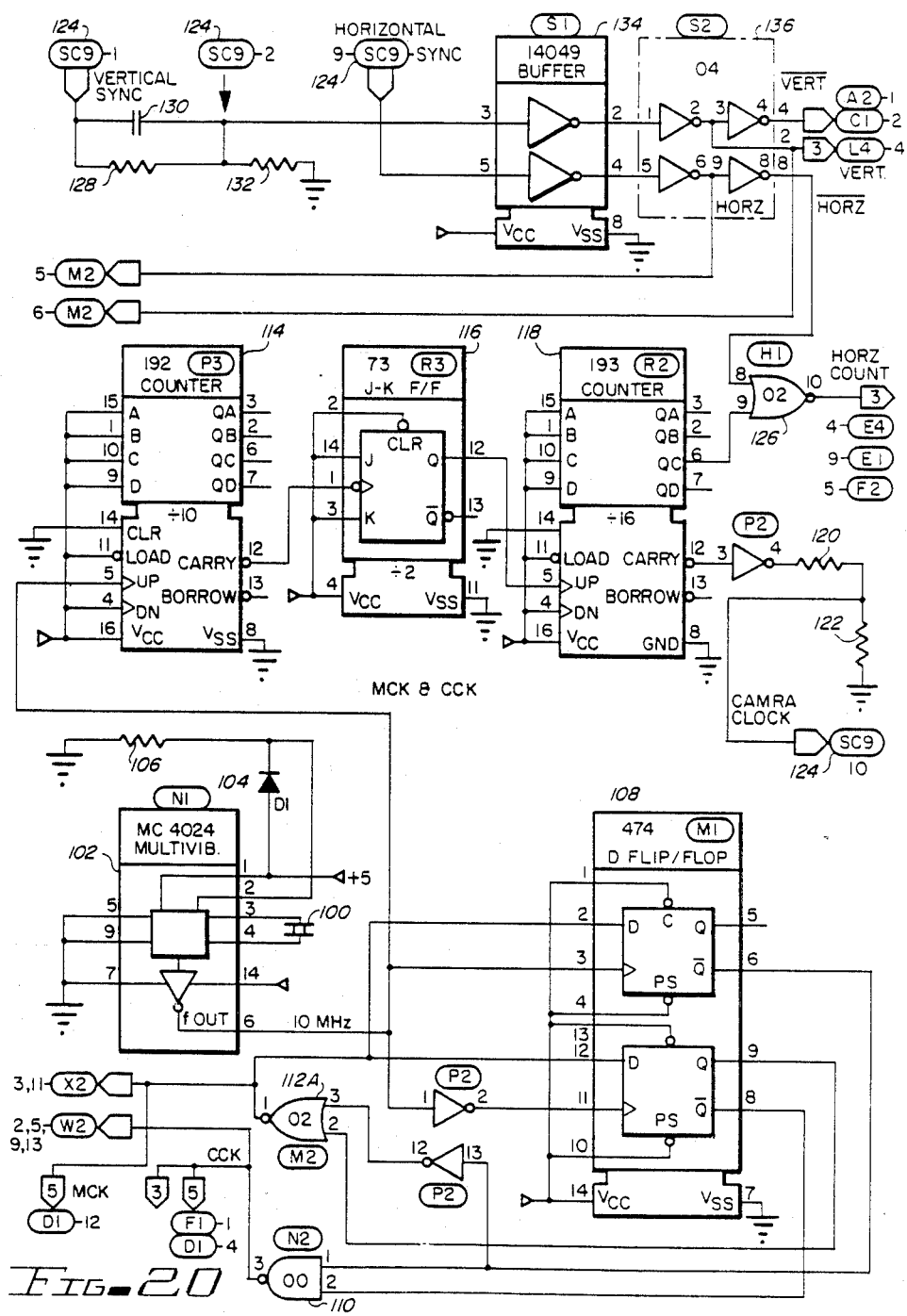
FIG. 20 is a diagram of a circuit which produces the various clock and pulse signals used throughout the numerous circuits of the invention.

Shown in FIG. 20 is the circuit which produces the various clock and pulse signals used throughout the numerous circuits of the invention. A 10 MHz crystal 100 is connected between pins 3 and 4 of a MC4024 multivibrator IC102. Pin 1 of IC102 is connected to Vcc (+5 v) and to the anode of a IN914 diode 104. The cathode of diode 104 is connected to pin 2 of IC102 and to ground through a 10 Kohm resistor 106. Pins 5, 7 and 9 of IC102 are all coupled to ground. Pin 14 of IC102 is connected to Vcc. Pin 6 of IC102 represents a 10 MHz square wave output signal.

The output of IC102, pin 6, is applied to pin 3 of the first half of a 7474 dual D flip/flop IC108. Pin 6 of IC102 is also inverted by a 7404 inverter and applied to pin 11 of the second half of IC108. Pins 1, 4, 10, 13 and 14 of IC108 are connected to Vcc. Pin 7 of IC108 is connected to ground, and pin 5 is left open. The $\overline{Q}$ output of the first D flip/flop, pin 6 of IC108, is coupled to input pin 1 of a 7400 NAND gate IC110. The other input, pin 2 of NAND gate IC110 is coupled to the $\overline{Q}$ output, pin 8, of the second D flip/flop of IC108. The output of IC110, pin 3, represents a COUNTER or "DOT" clock. The COUNTER clock has a period of 150 nano seconds, and is at a logical high level for 100 nano seconds. Pin 6 of IC108 is also inverted and applied to an input, pin 3, of a 7402 NOR gate IC112A. The second input, pin 2 of IC112A, is coupled to the Q output, pin 9, of the second D flip/flop of IC108. The output of IC112A, pin 1, is fed back to the D input, pins 2 and 12, of the first and second flip/flops of IC108. The output of IC112 also represents a MEMORY clock MCK, which is the inverse of the COUNTER clock.

Pin 6 of IC102 is also coupled to the up clock input, pin 5, of a 74192 counter IC114. Pins 1, 4, 9, 10, 11, 15 and 16 of IC114 are all coupled to Vcc. Pins 8 and 14 of IC114 are connected to ground. Pins 2, 3, 6, 7 and 13 of IC114 are all left open. The carry output, pin 12 of IC114, represents a divided (by ten) output equal to 1 MHz. IC114 divided the 10 MHz output of IC102 down to a 1 MHz signal.

The output of IC114 is coupled to the clock input, pin 1, of a 7473 J-K flip/flop IC116. Pins 2, 3 4, and 14 of IC116 are coupled to Vcc. Pin 11 of IC116 is connected to ground, and pin 13 is left open. The Q output, pin 12 of IC116, represents a 500 KHz square wave signal.

The output of IC116 is coupled to the up-counter input, pin 5, of a 74193 counter IC118. Pins 1, 4, 9, 10, 11, 15 and 16 of IC118 are coupled to Vcc. Pins 14 and 8 of IC118 are coupled to ground. Pins 2, 3, 7 and the borrow output, pin 13 of IC118, are all left open. Pin 6 of IC118 represents a 62.5 KHz square wave signal. The carry output, pin 12 of ICC118, represents a 31 KHz 31.2 usec high, 0.5 usec low signal. Thus, IC118 divides down the 500 KHz output of IC116 to produce both a 62.5 KHz signal and a 31 KHz signal.

The 31 KHz output from IC118, pin 12, is inverted and reduced by a voltage divider comprised of 680 ohm resistor 120 and 330 ohm resistor 122. At the junction of resistor 120 and 122 the 31 KHz signal is used as a CAMERA clock. The CAMERA clock reaches the exterior camera through pin 10 of an external connector 124. The other side of resistor 122 is coupled to ground.

The 62.5 KHz output from IC118, pin 6, is coupled to a first input, pin 9, of a 7402 NOR gate IC126.

A vertical SYNC signal from pin 1 of connector 124 is coupled to a 1.5 Mohm resistor 128 and to a 0.001 uf capacitor 130. The other sides of resistor 128 and of capacitor 130 are coupled together and to ground through a 100 Kohm resistor 132. The junction of resistor 128 and capacitor 130 is connected to a first input, pin 3, of a 14049 hex inverting buffer IC134. The output, pin 2 of IC134 is coupled to pin 1 of a 7404 inverter IC136. The output, pin 2 of IC136, represents a signal, VERT. The VERT signal is again inverted at pin 3 of IC136 and output at pin 4 of IC136 as a signal, $\overline{\text{VERT}}$.

A horizontal SYNC signal from pin 9 of connector 124 is coupled to the second input, pin 5, of inverting buffer IC134. The output, pin 4 of IC134, is inverted at pin 5 of IC136. The output at pin 6 of IC136 represents a signal HORZ. The HORZ signal is again inverted at pin 9 of IC136 and is output at pin 8 as a signal $\overline{\text{HORZ}}$. The signal $\overline{\text{HORZ}}$ is coupled to the second input, pin 8, of NOR gate IC126. The output of IC126, pin 10, represents a signal HORZ COUNT.

Pin 1 of buffer IC134 is coupled to Vcc. Pin 8 of buffer IC134 and pin 2 of connector 124 are coupled to ground.

Referring to FIG. 21, a circuit is shown which performs the function of the block diagram labeled FRONT END and shown in FIG. 5. The VIDEO IN signal is received from a video camera at pin A2 of connector 124 and is transferred on a coaxial cable. The VIDEO IN signal is connected to ground through a 1 Kohm resistor 138 and to the base of a 2N4124 transistor 140. The emitter of transistor 140 is coupled to the base of a second 2N4124 transistor 142. The collectors of transistors 140 and 142 are coupled together. The emitter of transistor 142 is coupled to the base of a third 2N4124 transistor 144 through a 270 ohm resistor 146. The base of transistor 144 is coupled to ground through a 270 ohm resistor 148. The collector of transistor 144 is connected to Vcc.

The collectors of transistors 140 and 142 are connected to the output, pin 4, of a 7402 NOR gate IC112B. The inputs of NOR gate IC112B pin 5 is connected at to the HORZ signal (pin 6 of IC136) and at pin 6 to the VERT signal (pin 2 of IC136). Thus, transistors 140 and 142 are controlled by the VIDEO IN signal at the base of transistor 140 and by the output of NOR gate 150 at the collectors of transistors 140 and 142.

The VIDEO IN signal is picked up at the base of transistor 144, after passing through the Darlington pair of transistors 140 and 142, and is then clamped and limited prior to being received at a voltage comparator. The VIDEO IN signal is clamped by three IN914 diodes 152, 154, and 156, which are connected in series and lead to ground. The VIDEO IN signal is then connected through a 75 ohm resistor 158 to the A− input, pin 1, of the first comparator of a MC3432 Quad Voltage Comparator IC160. Similarly, the VIDEO IN signal is coupled through a 75 ohm resistor 162 to the D− input, pin 9, of a fourth voltage comparator contained in IC160. The second and third comparators in IC160 are not used.

The A+ input, pin 2 of the first comparator in IC160, is coupled to pin 7 of connector 124 and to one side of 0.1 uf capacitor 164. The other side of capacitor 164 is coupled to ground and to pin 8 of connector 124. The A+ input, pin 2 of the first comparator in IC160, receives the DIE ADJUST signal as described when referring to FIG. 5. The D+ input, pin 10 of the fourth comparator in IC160, is similarly connected to pin 14 of connector 124 and to one side of a 0.1 uf capacitor 166. The other side of capacitor 166 is coupled to ground, to pin 4 of IC160, and to pin 15 of connector 124. The D+ input, pin 10, of the fourth comparator in IC160, receives the STREET ADJUST signal as described when referencing FIG. 5.

Pin 5 of connector 124 is connected to Vcc through the parallel combination of two 1 Kohm resistors 168 and 170. Pins 13 and 6 of connector 124 are individually coupled to Vcc through 5 Kohm resistors, 172 and 174, respectively.

The output, pin 3 of the first comparator in IC160, is coupled to Vcc through a 4.7 Kohm resistor 176 and to the D input, pin 2, of the first half of a 7474 dual D flip/flop IC178. The output, pin 11 of the fourth comparator in IC160, is similarly coupled to Vcc through 4.7 Kohm resistor 180 and to the D input, pin 12, of the second half of IC178. Pin 14 and the $\overline{\text{CLEAR}}$ inputs of the two flip/flops of IC178, pins 1 and 13, are all coupled to Vcc. Pin 7 of IC178 is coupled to ground. Pin 4 of the first flip/flop and pin 10 of the second flip/flop of IC178 are both coupled to the output of the NOR GATE IC112B. Both flip/flops of IC178 are clocked, at pins 3 and 11, by the MEMORY clock MCK from pin 1 of NOR gate IC112A.

The Q output, pin 6 of the first flip/flop of IC178, is coupled to the first input, pin 4 of AND gate 182B of a 7408 quad AND IC182. The Q output, pin 5 of the first flip/flop of IC178 is not used. The $\overline{\text{Q}}$ output, pin 8 of the second flip/flop of IC178, is coupled to the first input, pin 12, of AND gate 182D of IC182. The Q output, pin 9 of IC178, is similarly not used. Even though pins 5 and 9 of IC178 are not used, they are connected to input pins 1 and 10, respectively, of AND gates 182A and 182C, respectively, of IC182. However, the outputs of the AND gates 182A and 182C of IC182, pins 3 and 8, respectively, are left open. The second input of each AND gate of IC182, pins 2, 5, 9 and 13, is coupled to the COUNTER clock (CCK) at the output, pin 3, of AND gate IC110.

The $\overline{\text{Q}}$ output, pin 8 of IC178, is also coupled directly to the SNAPSHOT RAM circuit 34 to be described below. The output of the AND gate 182B of IC182, pin 6, represents the digitized die signal and is coupled directly to the COUNTER block circuit 30, to be described below. In addition, the output of AND gate 182B is coupled to pin 4 of a 7408 AND gate 184A. The output of AND gate 182D of IC182, pin 11, represents the digitized stress signal and is coupled to pin 12 of 7408 AND gate 184B. An input to a third 7408 AND gate 184C, at pin 10, comes from the CHARACTER GENERATOR circuit 46 to be described below. An input, pin 1, of a fourth 7408 AND gate 184D is coupled to the 8-to-1 select 344 FIG. 27A from the PATTERN LOOK-UP RAM 38 to be described below AND gates 184A, 184B, 184C and 184D comprise a single 7408 quad AND gate labelled generally as IC184. Pin 5 of AND gate 184A, Pin 13 of AND gate 114B, Pin 9 of AND gate 184C, and Pin 2 of AND gate 184D are coupled to select signals at pins 10, 11, 12 and 13 of a control PIA to be described below (IC406).

The outputs pins 6, 11, 8 and 3 of quad AND gate IC184 are diode-OR'ed together by IN914 diodes 150A, 150B, 150C and 150D, the outputs of which are coupled to the emitter of the transistor 144. The emitter of the transistor 144 serves as the VIDEO OUT signal, which is transferred to the CRT through pin A1 of connector 124.

Figure 22:
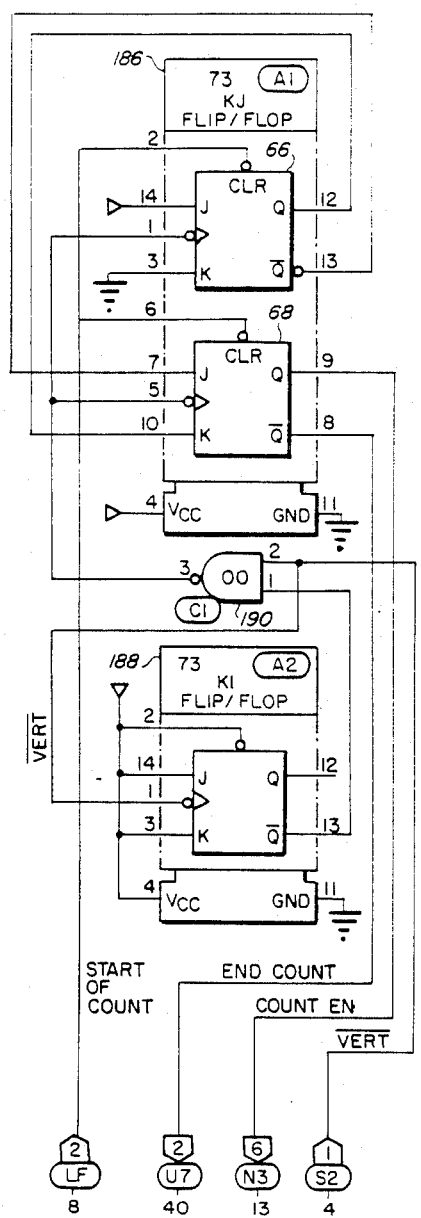
FIG. 22 is a diagram of a circuit which functions as the ARMING circuit shown in FIG. 6.

Referring to FIG. 22 a circuit is shown which functions as the ARMING circuit described above when referencing FIG. 6. A START OF COUNT signal is output from pin 39 of a control PIA, (IC406) to be described below. The $\overline{\text{START OF COUNT}}$ signal is inverted to produce a START OF COUNT signal which is used to clear the counters in the COUNTER block 30. The signal is again inverted, to increase drive capability of the START OF COUNT signal which is applied to the ARMING circuit.

The START OF COUNT signal is applied to the clear input, pin 2 of the first half of a 7473 dual J-K flip/flop IC186, referenced earlier as flip/flop 66. The START OF COUNT signal is also applied to the clear input, pin 6 of the second half of IC186, referenced earlier as flip/flop 68. Thus, both flip/flops of IC186 are cleared by the START OF COUNT signal when it is low. Pin 4 of IC186 is coupled to Vcc. Pin 11 of IC186 is coupled to ground. A third 7473 J-K flip/flop IC188 has pins 2, 3, 4 and 14 coupled to Vcc. Pin 11 of IC188 is coupled to ground. Pin 12 (the Q output of IC188) is left open. The third flip/flop, IC188, is clocked at pin 1 by the signal $\overline{\text{VERT}}$. The $\overline{\text{Q}}$ output of IC188 is coupled to the first input, pin 1, of a 7400 NAND gate IC190. The second input, pin 2 of IC190, is connected to the $\overline{\text{VERT}}$ signal. The output, pin 3 of NAND gate IC190, is used to clock both flip/flops 66 and 68 of IC186 at pins 1 and 5, respectively. The J input, pin 14 of flip/flop 66 is coupled to Vcc. The K input, pin 3 of flip/flop 66, is coupled to ground. The Q output, pin 12 of flip/flop 66, is coupled to the K input, pin 10, of flip/flop 68. The $\overline{\text{Q}}$ output, pin 13 of flip/flop 66, is coupled to the J input, pin 7, of flip/flop 68. The Q and $\overline{\text{Q}}$ outputs of flip/flop 68, pins 9 and 8, respectively, provide the COUNT ENABLE and END OF COUNT signals, respectively.

Figure 23:
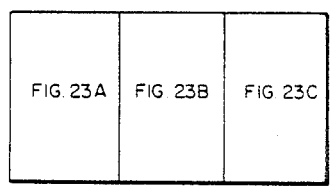
FIG. 23 is a diagram of a circuit which functions as the COUNTER BLOCK shown in FIG. 8.

Shown in FIG. 23 is a circuit which functions as the COUNTER block 30 described above when referencing FIG. 8. To create each 16-bit counter block, of which there are three (A, B and C), four 4-bit counters are connected in series, as will be explained. Each 16-bit block is read by a separate peripheral interface adapter (PIA). Counter block A is read by a 6821 PIA IC192; counter block B is read by a 6821 PIA IC194; counter block C is read by a 6821 PIA IC196. Each PIA receives and sends data from an 8-line VIDEO DATA bus from a MPU INTERFACE BOARD to be described below. The data is received at pins 26 through 33 on each of the PIA's, IC192, IC194 and IC196. Each PIA is coupled to a R/W signal at pin 21, a RSφ signal at pin 36, a RS1 signal at pin 35, a $\overline{\text{RESET}}$ signal at pin 34, and an ENABLE (E) signal at pin 25. Pin 1 of each PIA is coupled to ground. Pins 20, 22 and 24 of each PIA are coupled to Vcc. Pins 18, 19, 37, 38 and 39 of each PIA are left open. The CS2 input to PIA IC192, pin 23, is controlled by a PIA SEL A signal (from IC418 pin 8). The $\overline{\text{CS2}}$ input, pin 23, of PIA IC194, is controlled by PIA SEL B signal (from IC 418 pin 9). The $\overline{\text{CS2}}$ input, pin 23 of PIA IC196, is controlled by a PIA SEL C signal (fron IC 418 pin 1Q). The above select signals received by the PIA's IC's 192, 194 and 196, are sent by the MPU INTERFACE BOARD.

All twelve counters are cleared at pin 14 by the START OF COUNT signal from the MPU INTERFACE BOARD. Pins 1, 4, 9, 10, 11, 15 and 16 of each counter are coupled to Vcc. Pin 8 of each counter is coupled to ground. The borrow output, pin 13 of each counter, is left open.

As mentioned above, counter block A consists of four 74193 4-bit counter IC202, IC204, IC198 and IC200, coupled together in series to function as a 16-bit counter. Similarly, counter block B consists of four 74193 4-bit counters IC210, IC212, IC206, and IC208, coupled together in series. Finally, counter block C consists of four 74193 4-bit counters IC218, IC220, IC214 and IC216, similarly coupled together in series to form a 16-bit counter. Counters IC200, IC208, and IC216 are clocked at pin 5 by the carry output, pin 12, of counters IC198, IC206, and IC214, respectively. IC198, IC206, and IC214 are clocked at pin 5 by the carry output, pin 12, of counters IC204, IC212, and IC220, respectively. Similarly, counters IC204, IC212 and IC220 are clocked at pin 5 by the carry output, pin 12, of counters IC202, IC210 and IC218, respectively. Finally, counters IC202, IC210 and IC218 are clocked by the inverted output of 7410 three-input NAND gates IC222, IC224 and IC226, respectively. The carry output, pin 12 of counters IC200, IC208 and IC216, is connected to the CA1 input, pin 40, of PIA's IC192, IC194 and IC196, respectively.

A first input to each of the NAND gates IC222, IC224 and IC226 is the digitized die signal, VIDEO DIE, from the FRONT END. A second input to each of the NAND gates is the COUNT ENABLE signal from the ARMING circuit of FIG. 22. The final input to NAND gate IC222 is a WINDOW COUNTER A signal from PATTERN LOOK UP RAM CIRCUIT (IC342, Pin 6). The final inputs to NAND gates IC224 and IC226 are signals WINDOW COUNT B and WINDOW C respectively, also from the PATTERN LOOK UP RAM circuit (IC342, pins 8 and 11).

The outputs, pins 3, 2, 6 and 7 of counters IC198, IC206 and IC214, are connected to inputs, pins 2, 3, 4 and 5 of PIA's IC192, IC194 and IC196, respectively. The outputs, pins 3, 2, 6 and 7 of counters IC200, IC208 and IC216, are connected to the inputs, pins 6, 7, 8 and 9, of PIA's IC192, IC194 and IC196, respectively. The outputs, pins 3, 2, 6 and 7 of counters IC202, IC210 and IC218, are connected to inputs, pins 10, 11, 12 and 13 of PIA's IC192, IC194 and IC196, respectively. Finally, the outputs, pins 3, 2, 6 and 7 of counters IC204, IC212 and IC220 are connected to inputs, pins 14, 15, 16 and 17 of PIA's IC192, IC194 and IC196, respectively.

Figure 24C:
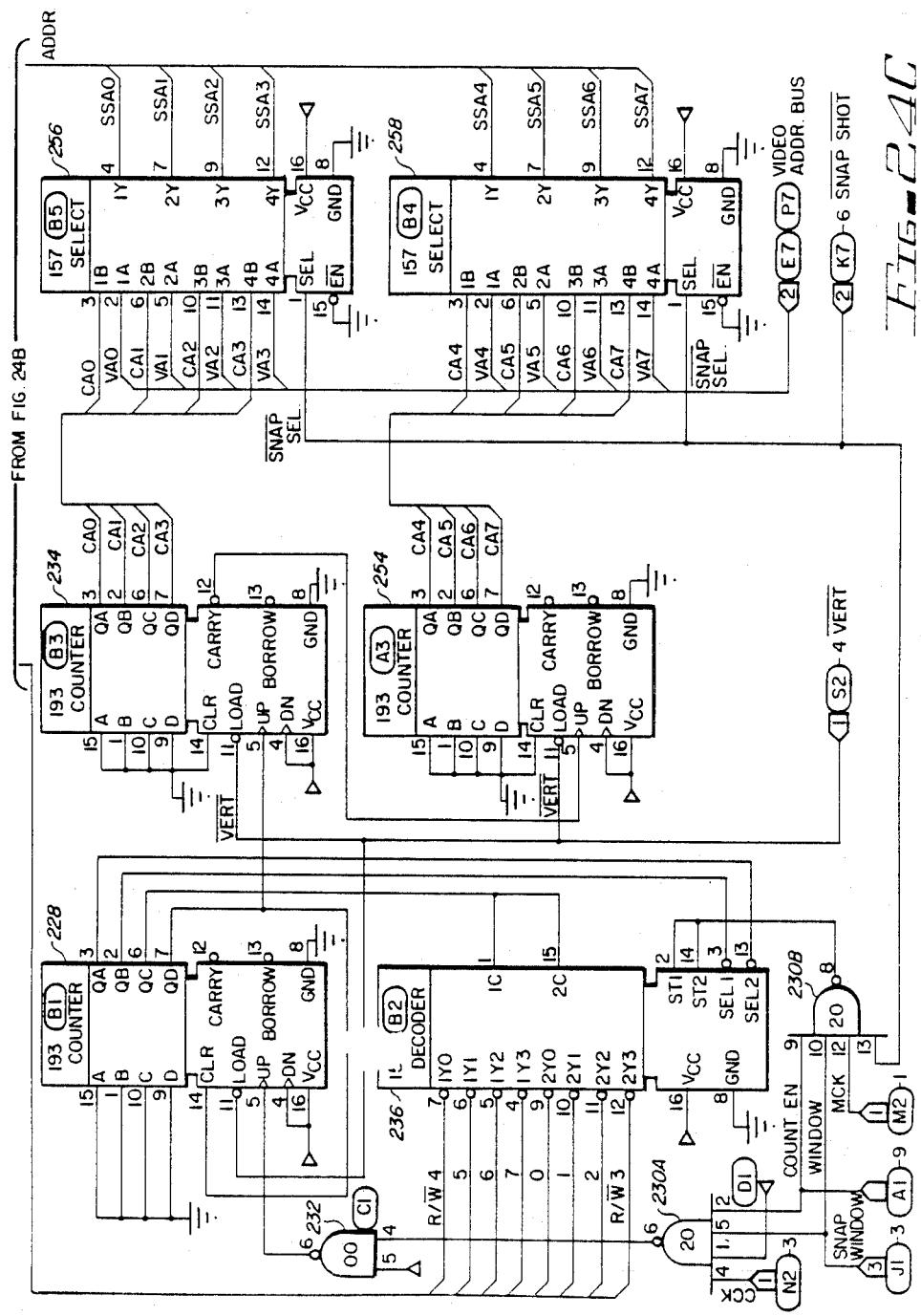
FIG. 24 is a diagram of a circuit which functions as the SNAPSHOT RAM circuit shown in FIG. 9.
Figure 25A:
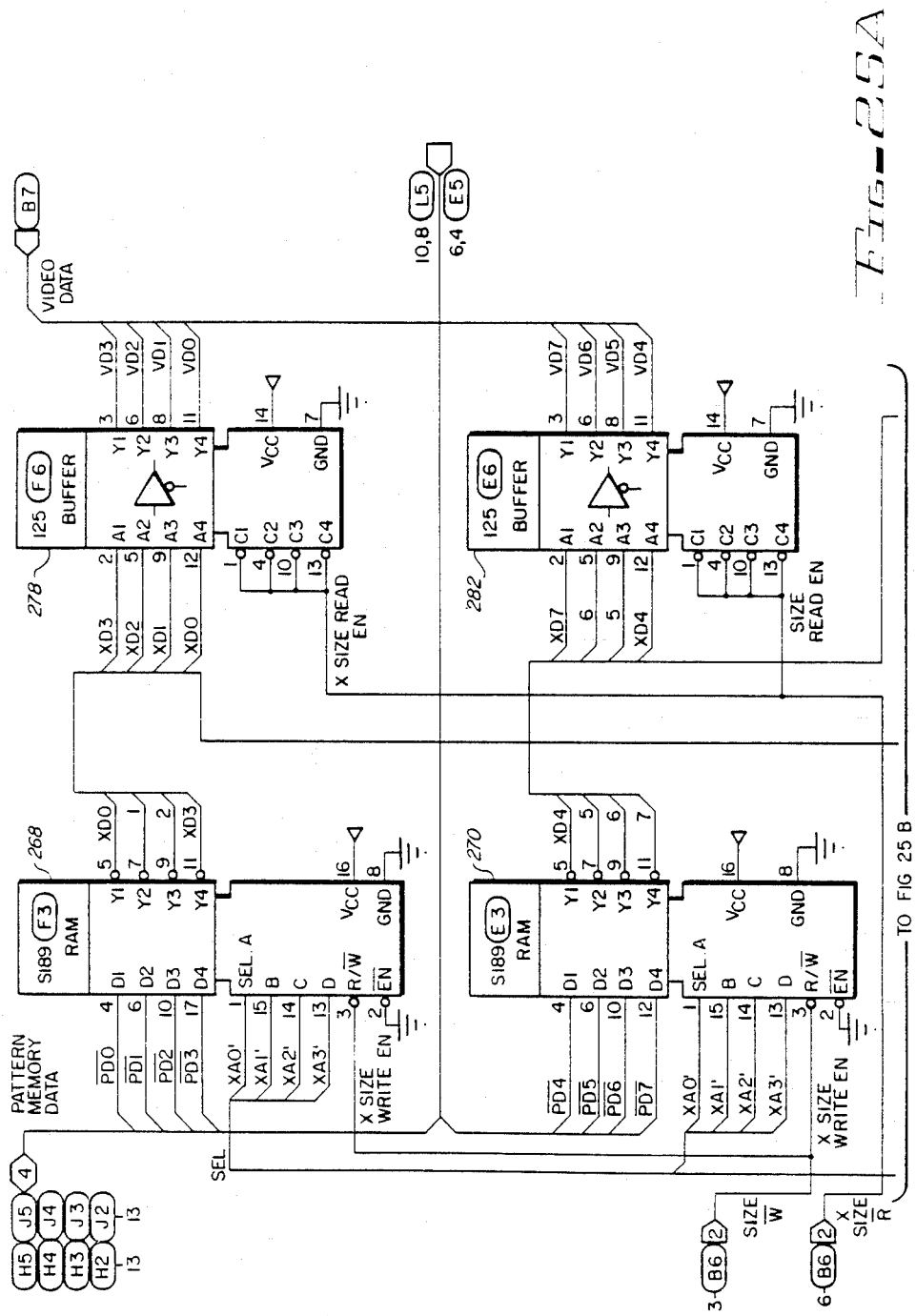

Shown in FIG. 24 is a circuit which functions as the SNAPSHOT RAM 34 described in FIG. 9 above. A 74193 4-bit up counter, IC228, is clocked at its up input pin 5 by the inverted output of a 7420 4-input NAND gate IC230A. The inputs to the NAND gate consist of the COUNT ENABLE signal from the ARMING circuit (pin 9 of IC186), which is applied to input pin 2; the COUNTER clock (CCK) signal from the clocking circuit described in FIG. 20, which is applied to input pin 4; and a SNAP WINDOW signal from PATTERN LOOK UP RAM circuit (IC342 pin 3) applied to input pin 5. Input pin 1 of the NAND gate IC230A is coupled to Vcc. The output, pin 6 of the NAND gate IC230A, is inverted at input pin 4 by a 7400 2-input NAND gate IC232. The second input pin 5 of NAND gate IC232 is coupled to Vcc. As mentioned above, the output, pin 6 of NAND gate IC232 clocks counter IC228 at pin 5.

The load input, pin 11 of counter IC228, is coupled to the $\overline{\text{VERT}}$ signal from the clocking circuit described in FIG. 20. Pins 4, and 16 of IC228 are coupled to Vcc. Pins 8, 1 9, 10, 15 of IC228 is coupled to ground. Output pin 7 of IC228 is fed back to the clear input pin 14 and to the up clock pin 5 of of a 74193 4-bit up counter IC234. The carry and borrow outputs, pins 12 and 13, respectively, are both left open. Outputs, pins 2, 3 and 6 of IC228, provide 3 lines of input to a 74155 3-line to 1-of-8 line decoder IC236. Output pin 3 of IC228 is coupled to the Sel 2 input pin 13 of IC236. Output pin 2 of IC228 is coupled to the Sel 1 input pin 3 of IC236. Output pin 6 of IC228 is coupled to input pins 1 and 15 (Sel 3) of IC236. Pin 16 of IC236 is coupled to Vcc. Pin 8 of IC236 is coupled to ground. The ST1 and ST2 inputs, pins 2 and 14, respectively, of IC236 are coupled to the output, pin 8, of four-input NAND gate IC230B. The input signals to the NAND gate IC230B are the COUNT ENABLE signal from the ARMING circuit, which is coupled to pin 9; the WINDOW ENABLE signal (SNAP) from bit 7 of the PATTERN GENERATOR, which is applied to pin 10; the MEMORY clock (MCK) from the clocking circuit described above, which is applied to pin 12; and a $\overline{\text{SNAPSHOT}}$ signal from MPU INTERFACE BOARD (IC 418, pin 6), which is coupled to pin 13.

The outputs of the 3-line to 1-of-8 line decoder IC236 are coupled to the R/$\overline{\text{W}}$ inputs of eight 256×1 $\overline{\text{S201}}$ RAMS. The eight RAMS make up the 256×8 SNAPSHOT MEMORY. Output pin 9 of IC236 is coupled to the R/$\overline{\text{W}}$ input, pin 12 of $\overline{\text{S201 RAM}}$ IC238. Pin 10 of IC236 is coupled to pin 12 of S201 RAM IC240. Similarly, pins 11, 12, 7, 6, 5 and 4 of IC236 are coupled to pin 12 of S201 RAMS IC242, IC244, IC246, IC248, IC250 and IC252, respectively.

Four-bit counter IC234 is coupled in series to another 74193 4-bit up counter IC254, so as to perform as an 8-bit up counter. The carry output, pin 12 of IC234, is coupled to the up clock input, pin 5, of IC254. Pins 1, 8, 9, 10, 14 and 15 of IC234 are coupled to ground. Pins 4 and 16 are coupled to Vcc. The load input, pin 11 of IC234, is coupled to the $\overline{\text{VERT}}$ signal from the clocking circuits described above. Similarly, pins 1, 8, 9, 10, 14 and 15 of IC254 are coupled to ground. Pins 4 and 16 of IC254 are coupled to Vcc. The load input, pin 11 of IC254, is clocked by the $\overline{\text{VERT}}$ signal. Both the carry and the borrow outputs, pins 12 and 13 of IC254, respectively, are left open.

The outputs, pins 3, 2, 6 and 7 of both counters IC234 and IC254, are coupled to a first set of inputs, pins 3, 6, 10 and 13, respectively, of two 74157 one-of-two selects IC256 and IC258, respectively. A second set of inputs, pins 2, 5, 11 and 14 of IC256 and IC258, are coupled to the VIDEO ADDRESS BUS from the VIDEO BOARD. The select input, pin 1 of both IC256 and IC258 is coupled to the $\overline{\text{SNAPSHOT}}$ SEL signal from the MPU INTERFACE BOARD (IC418 pin 6). Pins 8 and 15 of both IC256 and IC258 are coupled to ground. Pin 16 of IC256 and IC258 is coupled to Vcc. Thus, counters IC234 and IC254 provide an 8-bit up counter, whose data is routed to one-of-two selects IC256 and IC258, where either data from the 8-bit up counter or from the 8-bit VIDEO ADDRESS BUS is chosen to be routed to the SNAPSHOT RAMS, IC238 through IC252.

Outputs, pins 4, 7, 9 and 12, of IC256 are coupled to the inputs, pins 1, 2, 15 and 7, respectively, of the SNAPSHOT RAMS IC238 through IC252. Similarly, outputs, pins 4, 7, 9 and 12 of IC258, are coupled to the inputs, pins 9, 10, 11 and 14, respectively, of the SNAPSHOT RAMS IC238 through IC252. Pins 3, 4, 5 and 8 of the SNAPSHOT RAMS IC238 through IC252 are coupled to ground. Pin 16 of IC238 through IC252 is coupled to Vcc.

Data from the FRONT END, in the form of the SNAPSHOT VIDEO ALIGN signal (pin 8 of IC178), is coupled to the data in input, pin 13 of SNAPSHOT RAMS IC238 through IC252. The data from the data out output, pin 6 of the SNAPSHOT RAMS IC238 through IC252, forms 8-lines of data which are buffered by a pair of 6887-8T97 Tri-State Buffers IC260 and IC262. In particular, the output, pin 6 of SNAPSHOT RAMS IC238 and IC240, is coupled to pins 2 and 4, respectively, of IC262. The output, pin 6 of SNAPSHOT RAMS IC242 through IC252, is coupled to pins 14, 12, 10, 6, 4 and 2, respectively, of buffer IC260. Pins 1 and 15 of both buffers IC260 and IC262 are coupled to a SNAP $\overline{\text{R}}$ signal from the MPU INTERFACE BOARD (IC424 Pin 8). Pin 16 of IC260 and IC262 is coupled to Vcc. Pin 8 of IC260 and IC262 is coupled to ground. Inputs, pins 6, 10, 12, and 14, and outputs, pins 7, 9, 11 and 13 of IC262, are all left open. Outputs, pins 3 and 5 of IC266 and pins 3, 5, 7, 9, 11 and 13 of IC260, tie into the 8-line VIDEO DATA BUS.

Figure 25:
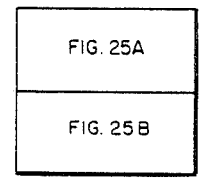
FIG. 25 is a diagram of a circuit which functions as the X-SIZE block generator shown in FIG. 11.
Figure 23A:
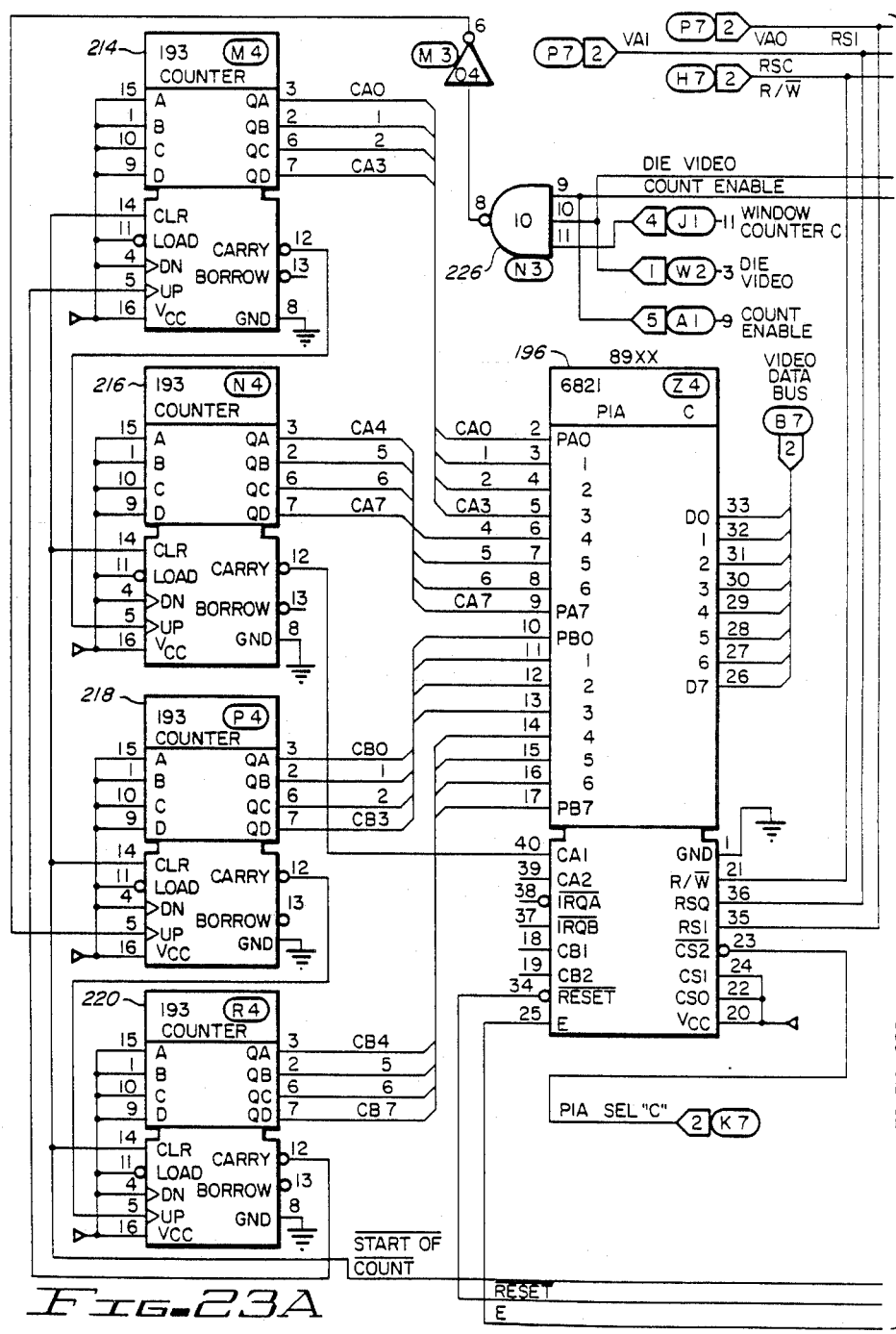
Figure 23B:
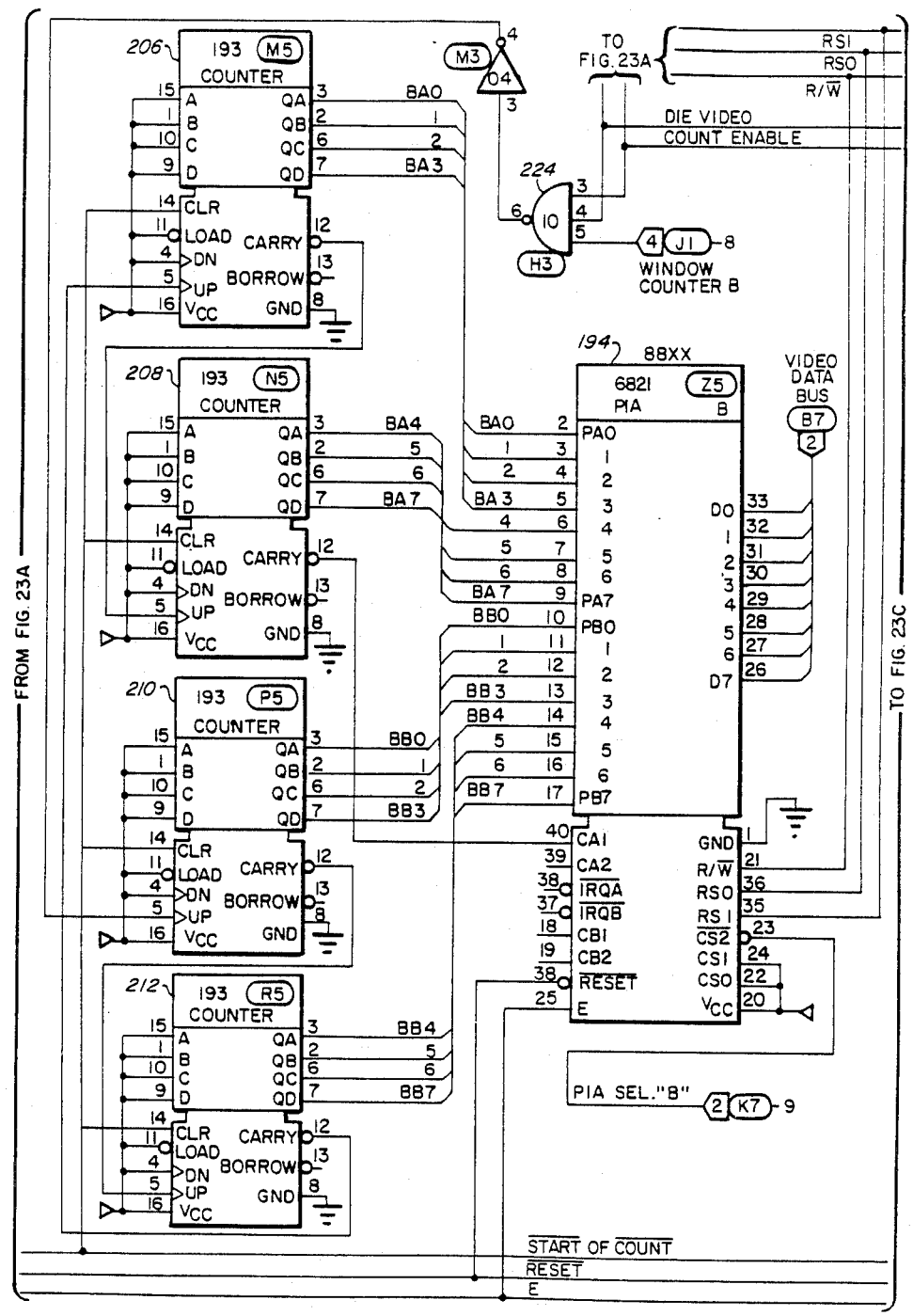
Figure 23C:
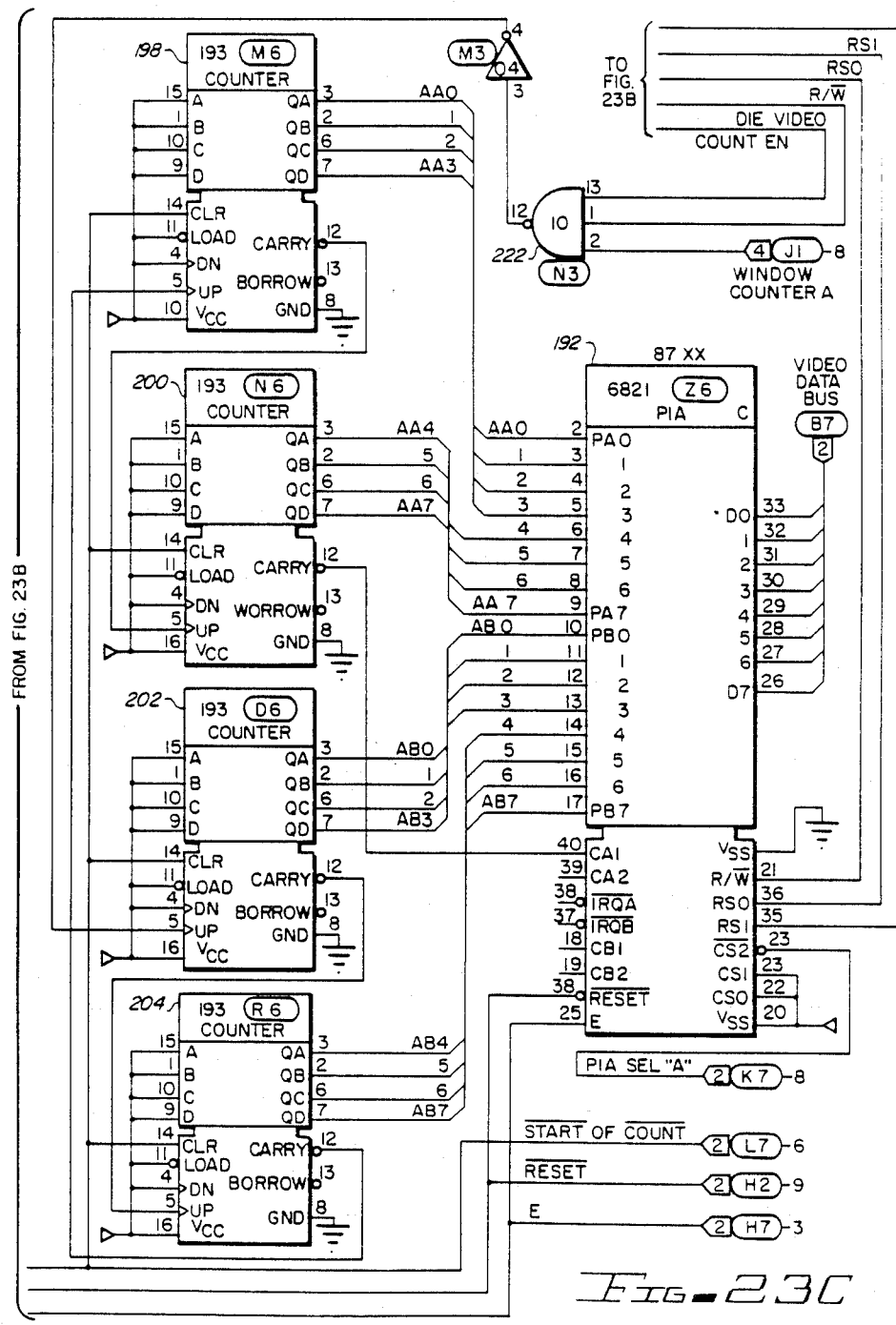

Shown in FIG. 25 is a circuit which functions as the X-SIZE BLOCK GENERATOR described above when referencing FIG. 11. Eight-lines of data, labeled PATTERN MEMORY DATA are coupled to the data in inputs, pins 4, 6, 10 and 12 of two 74S189 16-byte×4-bit RAMS IC268 and IC270. Thus, the two 16-byte×4-bit RAMS function, in combination, as a 16-byte by 8-bit RAM. Each line of a 4-line address is coupled to the RAMS IC268 and IC270 at one of the select pins 1, 15, 14 and 13, respectively. The 4-line address is the output, from pins 4, 7, 9 and 12, of a 74157 one-of-two select IC272. Pins 2 and 8 of IC268 and IC270 are coupled to ground. Pin 16 of IC268 and IC270 is coupled to Vcc. The R/$\overline{\text{W}}$ input, pin 3 of IC268 and IC270, is controlled by the X-SIZE WRITE ENABLE signal from the MPU INTERFACE BOARD (IC422 pin 3).

One 4-line input to the select IC272 is the VIDEO ADDRESS BUS from the MPU INTERFACE BOARD, which is coupled to IC272 at pins 3, 6, 10 and 13. A second 4-line input to the select IC272, at pins 2, 5, 11 and 14, is the output, pins 3, 2, 6 and 7, respectively, of a 74193 up counter IC274. The select input, pin 1 of IC272, is controlled by a X-SIZE SELECT signal from the MPU INTERFACE BOARD (inverted output of pin 3 IC418). Pin 16 of select IC272 is coupled to Vcc. Pins 8 and 15 of IC272 are coupled to ground.

A second 74157 one-of-two select IC276 also receives as input at pins 3, 6, 10 and 13 the 4-line VIDEO ADDRESS BUS from the MPU INTERFACE BOARD. In addition, select IC276 also receives as the second 4-line input, at pins 2, 5, 11, and 14, the output from pins 3, 2, 6 and 7, respectively, of counter IC274. The select input, pin 1 of IC276, is controlled by a PATTERN SELECT signal from the MPU INTERFACE BOARD (the inverted output of pin 5, IC418). Pin 16 of select IC276 is coupled to Vcc. Pins 8 and 15 of IC276 are coupled to ground. The 4-line output, pins 4, 7, 9 and 12 of select IC276, is coupled to the PATTERN LOOK-UP RAM described below and is labeled the PATTERN MEMORY ADDRESS. Thus, either the 4-line output of the 4-bit up counter IC274 or the 4-line VIDEO ADDRESS BUS can be selected to be routed to the X-SIZE RAMS IC268 and IC270 and to PATTERN LOOKUP RAM. When the select input, pin 1 of IC272 is low, the 4-line input from counter IC274 is routed to RAMS IC268 and IC270. When the select input is high, the VIDEO ADDRESS BUS is routed to RAMS IC268 and IC270.

Pins 1, 4, 9, 10, 11, 15 and 16 of counter IC274 are coupled to Vcc. Pin 8 of IC274 is coupled to ground. The carry and borrow outputs, pins 12 and 13, respectively, are left open. The clear input, pin 14 of counter IC274, is controlled by the HORZ COUNT signal from the clocking circuit described above.

The 4-bit output, pins 5, 7, 9 and 11 of RAM IC268, is coupled to pins 12, 9, 5 and 2, respectively, of a 74125 data line buffer IC278 and to pins 15, 1, 10 and 9 of a 74193 4-bit down counter IC280. Similarly, the 4-bit output, pins 5, 7, 9 and 11 of RAM IC270, is coupled to pins 12, 9, 5 and 2, respectively, of a 74125 data line buffer IC282 and to pins 15, 1, 10 and 9 of a 74193 4-bit down counter IC284. Inputs, pins 1, 4, 10 and 13 of buffers IC278 and IC282, are coupled to the X-SIZE READ ENABLE signal from the MPU INTERFACE BOARD (IC422 Pin 6). Pin 14 of both IC278 and IC282 is coupled to Vcc. Pin 7 of IC278 and IC282 is coupled to ground.

Counters IC280 and IC284 are coupled together so as to function as an 8-bit down counter. The carry output, pin 12 of IC280, is coupled to the up clock input, pin 5, of IC284. The borrow output, pin 13 of IC280, is coupled to the down clock input, pin 4, of IC284. Pin 14 of IC280 and IC284 is coupled to ground. Pin 8 of IC280 and IC284 is coupled to ground. Pins 5 and 16 of IC280 and pin 16 of IC284 are coupled to Vcc. Outputs, pins 2, 3, 6 and 7 of IC280 and IC284, are left open. Both counters IC280 and IC284 are loaded at pin 11 by the Q2 output, pin 12, of the one shot 286B of a 74123 dual retrigerable one shot IC286. The carry output, pin 12 of IC284, is left open. The borrow output, pin 13 of IC284, serves as one of the inputs, at pin 10, of the one shot 286B and as the input to the up clock, pin 5, of the 4-bit up counter IC274.

The second input, pin 9 of the one shot 286B, is the HORZ COUNT signal from the clock circuit described above. Pins 11 and 16 of one shot 286B are coupled to Vcc. Pin 7 of IC286 is coupled to Vcc through a resistor 288. Output Q2, pin 5 of one shot 286B is coupled to a first input, pin 2, of a 7432 two-input OR gate IC290A. The second input, pin 1 of OR gate IC290A is the COUNTER clock (CCK) from the clock circuit described above. The output, pin 3 of the OR gate IC290A, is coupled to the down clock input, pin 4, of 4-bit up counter IC280.

Figure 26:
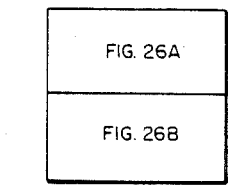
FIG. 26 is a diagram of a circuit which functions as the Y-SIZE BLOCK GENERATOR shown in FIG. 12.

The 4-lines of data from pins 3, 6, 8 and 11 of each of the buffers IC278 and IC282 forms an 8-line data bus called the VIDEO DATA BUS. The VIDEO DATA BUS is coupled to the MPU INTERFACE BOARD. In addition, the 8-line VIDEO DATA BUS is inverted by two 7404 inverters IC292 and IC294 (FIG. 26). Specifically, 4-lines of data are inverted by IC292 at input pins 11, 9, 5 and 3. Similarly, 4-lines of data are inverted by IC294 at input pins 11, 9, 5 and 3. The output of inverters IC292 and IC294, pins 10, 8, 6 and 4, is coupled to the 8-line PATTERN MEMORY DATA which is input to X-SIZE RAMS IC268 and IC270. Thus, the microprocessor, which is assessed thru the VIDEO DATA BUS from the MPU INTERFACE BOARD, can either read or write data sent through the X-SIZE RAMS IC268 and IC270.

Shown in FIG. 26 is a circuit which functions as the Y-SIZE BLOCK GENERATOR which was described above in reference to FIG. 12. The circuit for the Y-SIZE BLOCK GENERATOR is almost identical to that of the X-SIZE BLOCK GENERATOR described above and shown in FIG. 25. Two 74S189 16-byte×4-bit RAMS IC296 and IC298 are connected so as to form the required 16-byte×8-bit Y-SIZE RAM. Data is received from the 8-line PATTERN MEMORY DATA LINE at inputs 4, 6, 10 and 12 of the RAMS IC296 and IC298. As explained above, the VIDEO DATA BUS accesses the PATTERN MEMORY DATA LINE through inverters IC292 and IC294.

The addresses, pins 1, 15, 14 and 13 of the RAMS IC296 and IC298, are controlled by the output, pins 4, 7, 9 and 12, respectively, of a 74157 one-of-two select IC300. As with the X-SIZE BLOCK GENERATOR above, the 4-line output, pins 4, 7, 9 and 12 of a second 74157 one-of-two select IC302, is received by the PATTERN LOOK UP RAM CIRCUIT. Thus, the outputs of select IC276 and select IC302 form an 8-line PATTERN MEMORY ADDRESS, with the output of IC302 providing the most significant digits and IC276 providing the least significant digits.

One set of inputs, to pins 3, 6, 10 and 13 of both selects IC300 and IC302, is a 4-line VIDEO ADDRESS BUS from the MPU INTERFACE BOARD. The other set of inputs, to pins 2, 5, 11 and 14 of both selects IC300 and IC302, is the output from pins 3, 2, 6 and 7, respectively, of a 74193 4-bit up counter IC304. Pins 15 and 8 of IC300 and IC302 are coupled to ground. Pin 16 of both IC300 and IC302 is coupled to Vcc. Pins 1, 4, 9, 10, 11, 15 and 16 of IC304 are connected to Vcc. The counter IC304 is cleared at pin 14 by the VERT signal from the clock circuit described above. Pin 8 of IC304 is coupled to ground, while pins 12 and 13 remain open. Counter IC304 is clocked at its up clock input pin 5 by the borrow output, pin 13, of a 74193 4-bit counter IC306. The 4-bit counter IC306 is connected to a second 74193 4-bit counter IC308 so as to form an 8-bit down counter. Thus, the carry output, pin 12 of counter IC308, is coupled to the up clock input, pin 5, of counter IC306; the borrow output, pin 13 of IC308, is coupled to the down clock input, pin 4, of IC306. The carry output, pin 12 of IC306, is left open. Outputs, pins 2, 3, 6 and 7 of both counters IC306 and IC308 are left open. Pins 8 and 14 of both counters IC306 and IC308 are coupled to ground. Pins 5 and 16 of IC308 and pin 16 of IC306 are coupled to Vcc. The two counters, IC306 and IC308, are loaded at pin 11 by a Q1 output from pin 4 of the one shot 286A of the 74123 dual one shot IC286. Pin 15 of one shot 286A is coupled to Vcc through a 5.1Kohm resistor 314 and to pin 14 through a 200 pf capacitor 316.

As with the X-SIZE BLOCK GENERATOR, the inputs at pins 15, 1 10 and 9 of the 4-bit down counters IC306 and IC308 correspond to the outputs of pins 5, 7, 9 and 11, respectively, of the RAMS IC298 and IC296, respectively. Pins 2 and 8 of the RAMS IC296 and IC298 are coupled to ground. Pin 16 of the RAMS IC296 and IC298 is coupled to Vcc.

The 4-lines of output from each of the RAMS IC296 and IC298 are also coupled to the VIDEO DATA BUS through a pair of 74125 quad data buffers IC310 and IC312. In particular, pins 5, 7, 9 and 11 of IC296 are coupled to pins 12, 9, 5 and 2 of IC310, and pins 5, 7, 9 and 11 of IC298 are coupled to pins 12, 9, 5 and 2 of IC312. The 4-line output, pins 11, 8, 6 and 3 from each of the buffers IC310 and IC312, are coupled to the VIDEO DATA BUS. Pin 14 of IC310 and IC312 is coupled to Vcc. Pin 7 of IC310 and IC312 is coupled to ground.

The major differences between the X-SIZE and Y-SIZE BLOCK GENERATORS are the signals which are used to clock and/or control the various chips. In the Y-SIZE BLOCK GENERATOR, a first input, pin 1 to the one shot 286A, is the VERT signal from the clock circuit of FIG. 20. The second input, pin 2 of the one shot 286A, is the borrow output, pin 13, of the 4-bit down counter IC306 (the output of the functional 8-bit down counter). Pin 3 of one shot of 286A is coupled to Vcc. The down clock input to the 4-bit down counter IC308 (the clock input to the functional 8-bit down counter) is coupled to the output, pin 6, of a second 7432 two input OR gate 290B of IC290. The inputs, pins 4 and 5 of OR gate 290B, are coupled to the Q1 output, pin 13, of one shot 286A and to the HORZ COUNT signal from the clocking circuit of FIG. 20, respectively. The one-of-two select IC300 is controlled at its select input, pin 1, by a Y-SIZE SEL signal from the MPU INTERFACE BOARD (inverted output of pin 4, IC418). The one-of-two select IC302 is controlled at its select input, pin 1, by a PATTERN SEL signal from the MPU INTERFACE BOARD (invented output, pin 5 of IC418). Both of the Y-SIZE RAMS IC296 and IC298 are controlled at their R/$\overline{W}$ inputs, pin 3, by a Y-SIZE WRITE ($\overline{W}$) signal from the MPU INTERFACE BOARD (IC422 pin 8). The buffers IC310 and IC312 are controlled at the inputs, pins 1, 4, 10 and 13, by a Y-SIZE READ ($\overline{R}$) signal from the MPU INTERFACE BOARD (IC422 pin 11). Finally, a WINDOW ENABLE signal is generated by the output, pin 1, of a 7402 NOR gate IC318. The inputs, pins 2 and 3 to the NOR gate IC318, are Q1 and Q2 outputs, pins 13 and 5, respectively, of the first and second one shots of IC286.

Figure 27:
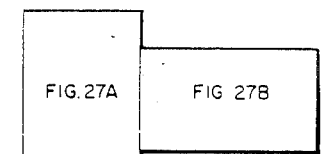
FIG. 27 is a diagram of a circuit which functions as the PATTERN LOOK UP RAM shown in FIG. 10.
Figure 27A:
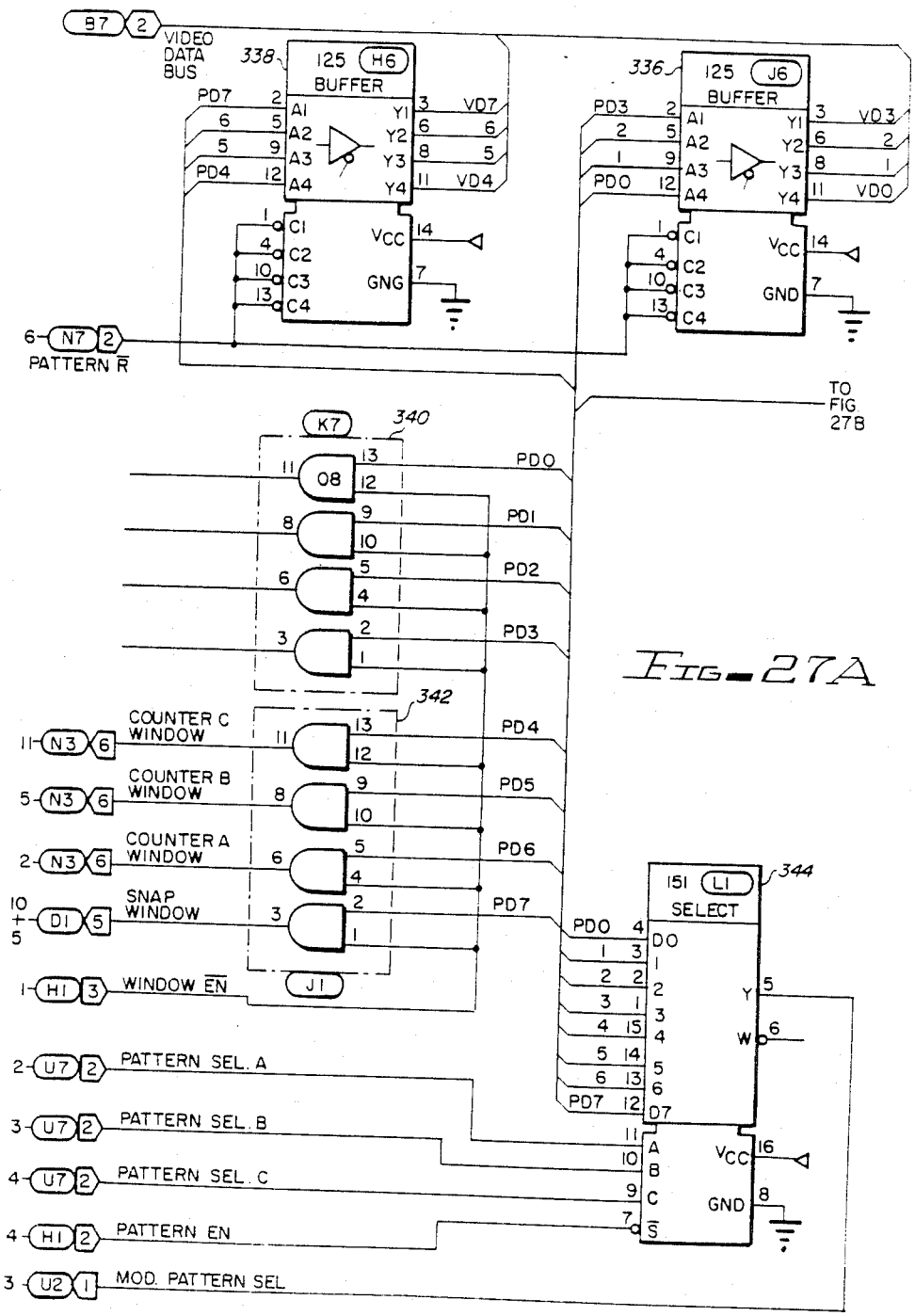
Figure 27B:
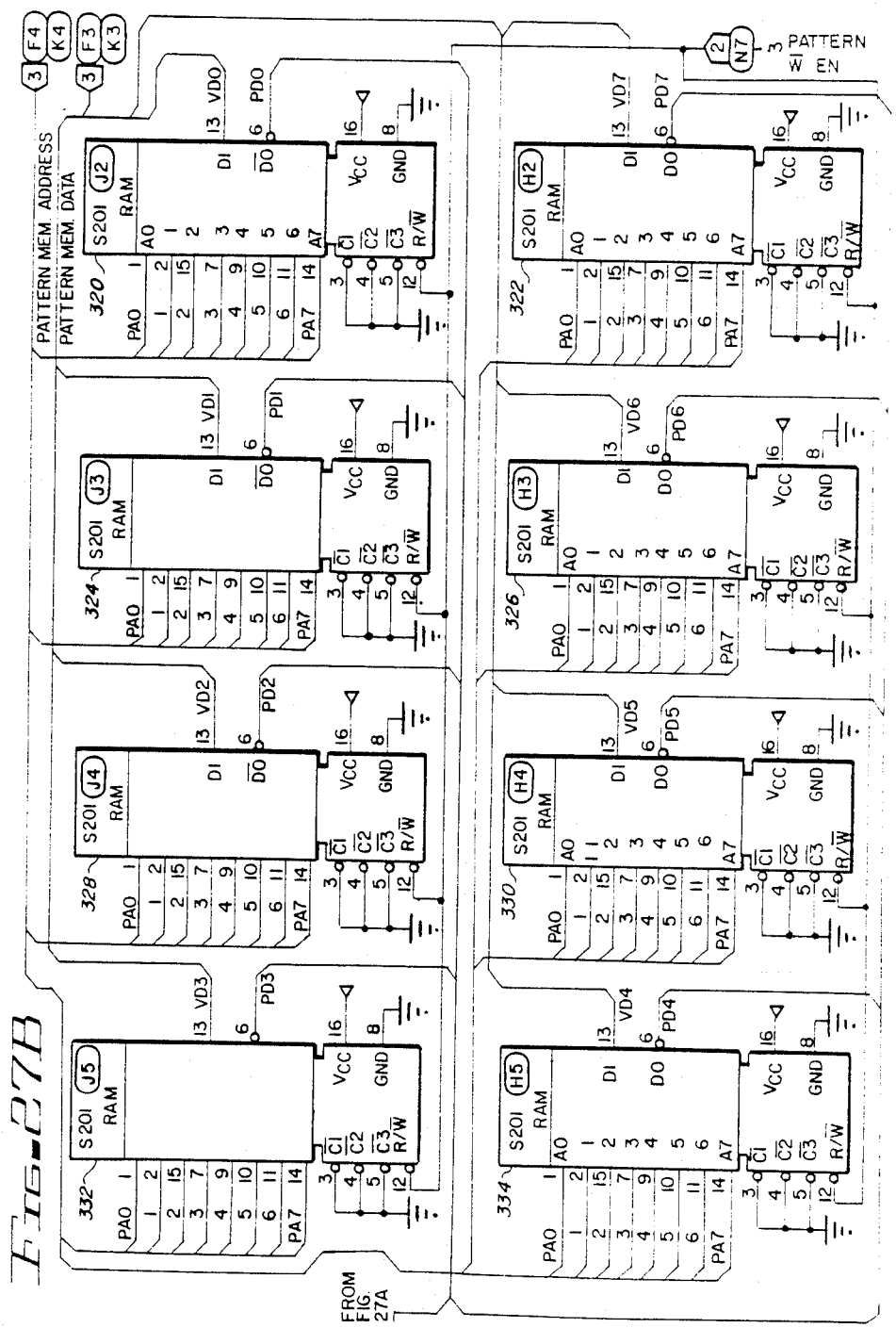

Referring to FIG. 27, a circuit is shown which functions as the PATTERN LOOK UP RAM described above when referencing FIG. 10. As explained above, 8 lines of data are carried on the PATTERN MEMORY ADDRESS, 4 lines from each the X-SIZE and Y-SIZE BLOCK GENERATORS. The 8 lines of data are received at pins 1, 2, 15, 7, 9, 10, 11 and 14 of eight 256-byte×1-bit 74S201 PATTERN LOOK UP RAMS IC320, IC322, IC324, IC326, IC328, IC330, IC332 and IC334. Each of the eight PATTERN LOOK UP RAMS have their R/$\overline{W}$ input, pin 12, controlled by a PATTERN WRITE ENABLE ($\overline{W}$) signal from the MPU INTERFACE BOARD (IC424 pin 3), and thus forms a 256-byte×8-bit memory. The PATTERN WRITE ENABLE signal is normally in the "READ" mode unless the MPU requires access to the PATTERN LOOK UP RAMS.

The MPU accesses the PATTERN LOOK UP RAMS IC320 through IC334 via the 8-line PATTERN MEMORY DATA BUS, one line of which is coupled to each PATTERN LOOK UP RAM at the data in (DI) input, pin 13. Pins 3, 4, 5 and 8 of each PATTERN LOOK UP RAM is coupled to ground. Pin 16 of each PATTERN LOOK UP RAM is coupled to Vcc.

The output, pin 6 of each PATTERN LOOK UP RAM, is combined to form an 8-line data bus. Each of the eight lines of data is buffered by one input of a pair of 74125 quad data buffers IC336 and IC338. Specifically, the output, pin 6 of PATTERN LOOKUP RAMS IC320, IC324, IC328 and IC332, is coupled to inputs, pins 12, 9, 5, and 2, respectively, of IC336. Similarly, the output, pin 6 of PATTERN LOOK UP RAMS IC322, IC326, IC330 and IC334, is coupled to inputs, pins 2, 5, 9 and 12, respectively, of IC338. The outputs, pins 3, 6, 8 and 11 of the buffers IC336 and IC338, form an 8-line VIDEO DATA BUS which transfers data to the MPU through the MPU INTERFACE BOARD. Each buffer IC336 and IC338 is controlled at pins 1, 4, 10 and 13 by a PATTERN READ ($\overline{R}$) signal from the MPU INTERFACE BOARD (IC424 Pin 6). Pins 14 and 7 of each buffer IC336 and IC338 are coupled to Vcc and ground, respectively.

Each line of the 8-line data bus from the eight PATTERN LOOK UP RAMS is coupled to one input of one gate of a pair of 7408 quad two-input AND gate IC340 and IC342. Specifically, the output, pin 6 of IC320, IC324, IC328 and IC332, is coupled to the input, pins 13, 9, 5 and 2, respectively, of IC340. Similarly, the output, pin 6 of IC322, IC326, IC330 and IC334, is coupled to the input, pins 2, 5, 9 and 13, respectively, of IC342. The second input of each AND gate, pins 1, 4, 10 and 12 of IC340 and IC342, is coupled to the WINDOW ENABLE signal from pin 1 of IC318. The outputs, pin 3, 6, 8 and 11 of IC340, are unused. The output, pin 3 of one AND gate of IC342, functions as the SNAP WINDOW signal applied to IC230 of the SNAPSHOT MEMORY. The outputs, pins 6, 8 and 11 of the remaining gates of IC342, function as the COUNT WINDOW A, COUNT WINDOW B and COUNT WINDOW C signals, respectively, which are coupled to the counters in the COUNTER BLOCK. Note that the unused outputs of IC340 could be utilized if more counters are deemed necessary (i.e. if a larger COUNTER BLOCK is used).

The 8-line data bus from the PATTERN LOOK UP RAMS IC320 through IC334 is also coupled to the inputs, pins 4, 3, 2, 1, 12, 13, 14 and 15, of a 74151 eight-to-one select IC344. The select IC344 is controlled at pins 11, 10, 9 and 7 by signals from the CONTROL PIA on the MPU INTERFACE BOARD (IC404). In particular, the signals PATTERN SEL A, PATTERN SEL B, PATTERN SEL C, and PATTERN ENABLE are coupled to pins 11, 10, 9 and 7, respectively. Pin 16 of IC344 is coupled to Vcc. Pin 8 of IC344 is coupled to ground. The output, pin 6, is left open. The output, pin 5, represents the MOD PATTERN SEL signal which is input to AND gate 184C at PIN 10 of IC184 in the FRONT END.

Figure 28A:
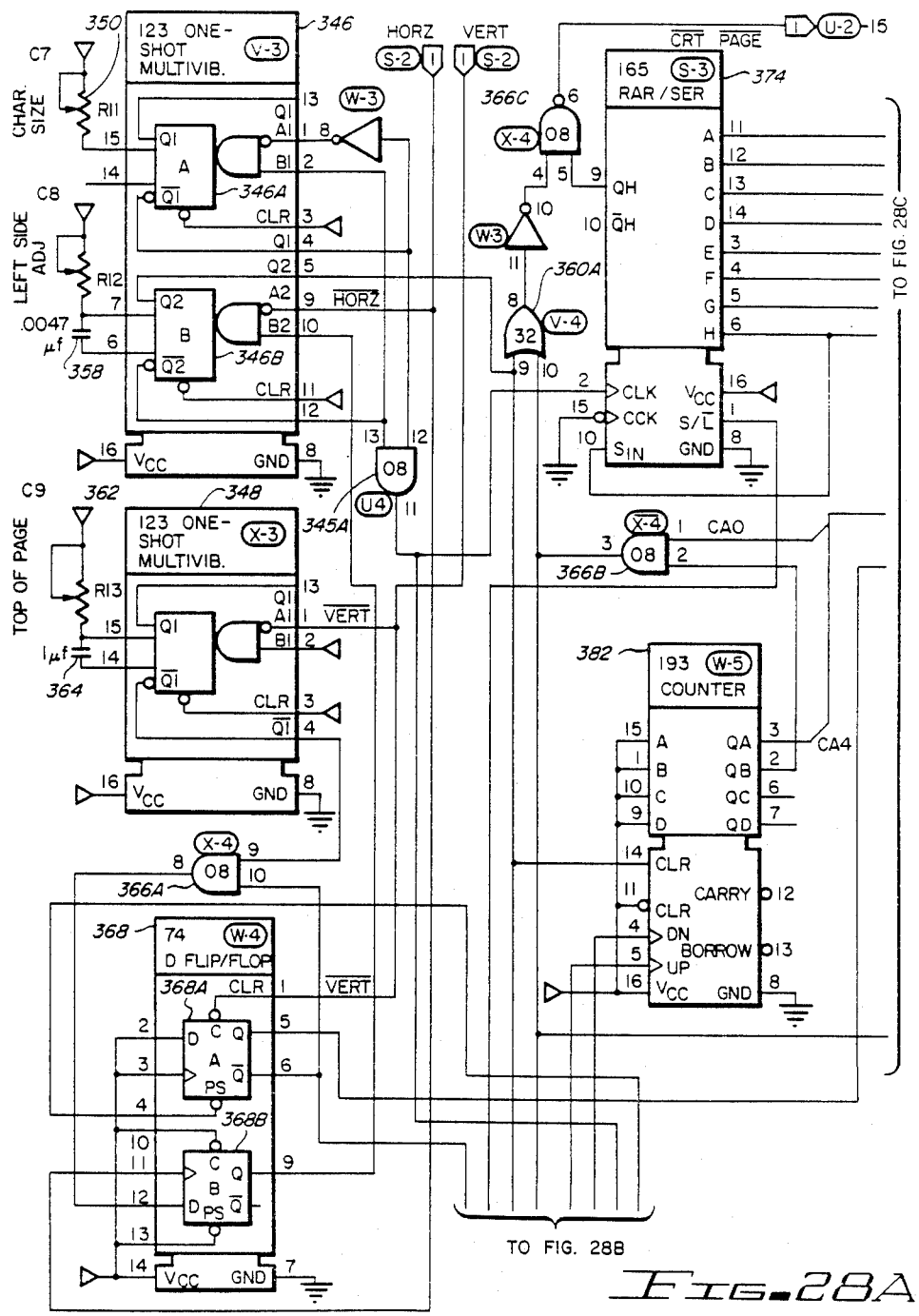
FIG. 28 is a diagram of a circuit which functions as the CHARACTER GENERATOR circuit shown in FIG. 4.
Figure 28C:
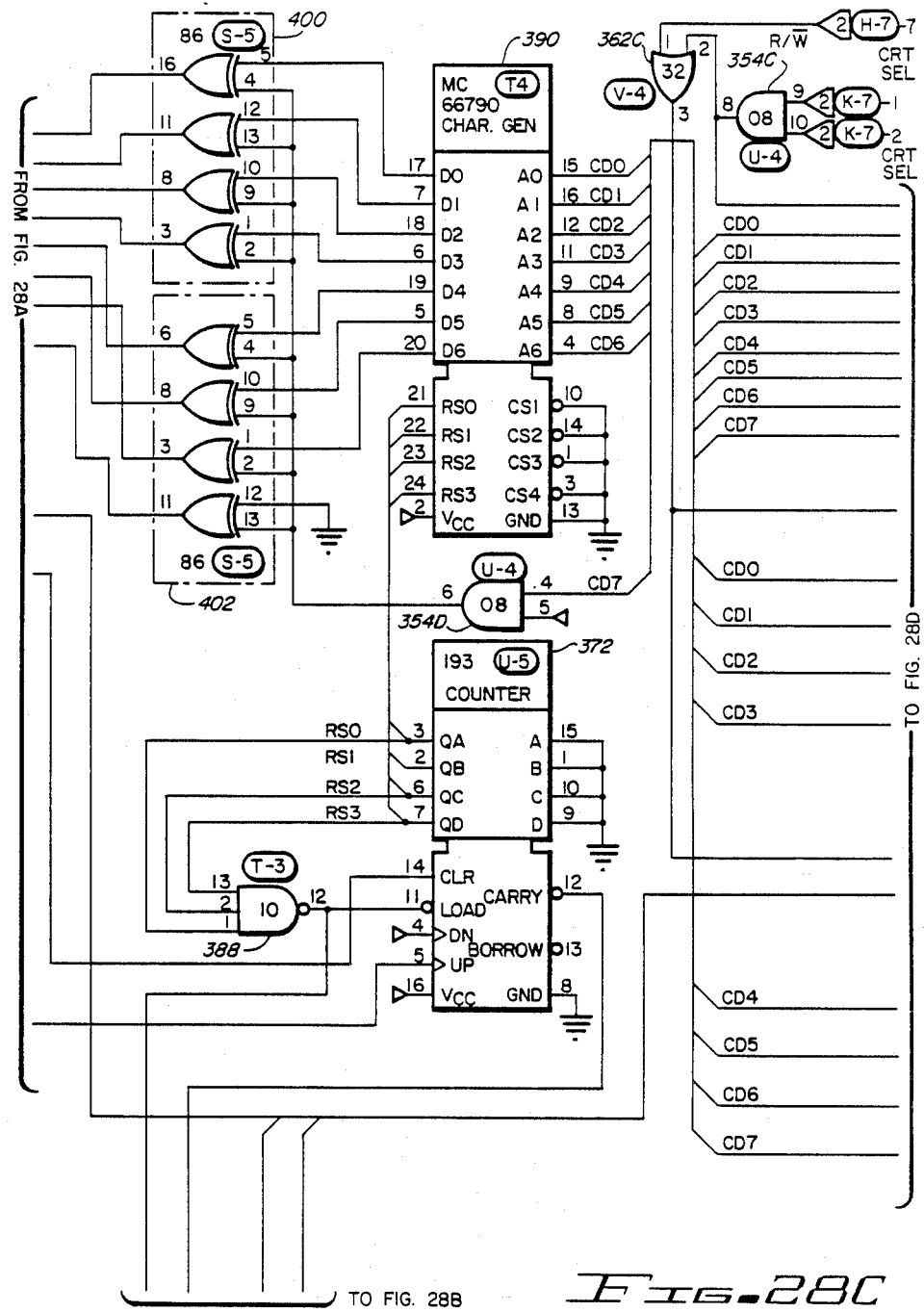

Referring to FIG. 28, a circuit is shown which functions as the CHARACTER GENERATOR circuit 46 described above in FIG. 4. The CHARACTOR GENERATOR circuit 46 produces the alpha numerics which are input to AND gate 184D at pin 1 of IC184 in the FRONT END. Two 74123 dual one shot multivibrators IC346 and IC348 provide the timing necessary to clock the various portions of the CHARACTER GENERATOR circuit.

The first one shot 346A of IC346 sets up the timing which controls the size of the characters. Pin 15 of the one shot 346A is coupled to Vcc through a 20Kohm adjustable resistor 350. Pin 14 of one shot 346A is open. The clear input, pin 3 of the one shot 346A, is coupled to Vcc. The Q1 output, pin 13 of the one shot 346A, is left open. The Q1 output, pin 4 of the one shot 346A, is coupled to the first input, pin 12, of one AND gate IC354A of a 7408 quad two-input AND gate. The Q1 output, pin 4 of one shot 346A, is also inverted and fed back to its A1 input, pin 1.

The second one-shot 346B of IC346 sets up the timing which controls the distance from the left side of the CRT before characters will appear. Pin 7 of one shot 346B is coupled to Vcc through a 20Kohm adjustable resistor 356 and to pin 6 of one-shot 346B through a 0.0047 uf capacitor 358. The clear input, pin 11 of one-shot 346B, is coupled to Vcc. The Q2 output of one-shot 346B, pin 12, is coupled to the B1 input, pin 2, of one-shot 346A. The A2 input, pin 9 of one-shot 346B, is coupled to the signal $\overline{HORZ}$ from the clock circuit described when referencing FIG. 20. The Q2 output, pin 5 of one-shot 346B, is coupled to a first input, pin 9, of one OR gate IC360A of a 7432 quad two-input OR gate. Pin 8 of IC346 is coupled to ground. Pin 16 of IC346 is coupled to Vcc.

The third one shot IC348 sets up the timing which controls the vertical delay at the top of the CRT. Thus, IC348 controls how far from the top of CRT the first line is displayed. Pin 15 of IC348 is coupled to Vcc through an adjustable 20Kohm resistor 362, and to pin 14 through a 1 uf capacitor 364. The Q1 output, pin 13 of IC348, is left open. Inputs, pins 2 and 3, and pin 16, of IC348 are coupled to Vcc. Pin 8 of IC348 is coupled to ground. Input, pin 1 of IC348, is coupled to the $\overline{VERT}$ signal generated by the clock circuit described above. The Q1 output, pin 4 of IC348, is coupled to the first input, pin 9, of one AND gate 366A of a 7408 quad two-input AND gate.

The $\overline{VERT}$ signal is also coupled to the clear input, pin 1, of the first flip/flop 368A of a 7474 dual D flip/flop IC368. Pins 2 and 3 of flip/flop 368A, pins 10 and 13 of the second flip/flop 368B of IC368 and pin 14 of IC368 are coupled to Vcc. Pin 7 of IC368 is coupled to ground. The $\overline{Q}$ output of flip/flop 368A pin 6 is coupled to the second input, pin 10, of AND gate IC366A, and to the load input, pin 11 of a 74193 counter IC370. The output, pin 8 of AND gate IC366A, is coupled to the D input, pin 12, of flip/flop 368B. The second input, pin 11 of the flip/flop 368B, is coupled to the $\overline{HORZ}$ signal from the clock circuit. The Q output, pin 9 of flip/flop 368B, is coupled to the B2 input, pin 10, of the horizontal delay one-shot 346B of IC346. The Q output, pin 5 of flip/flop 368A, is coupled to the clear input, pin 14, of 74193 counter IC372. The carry output, pin 12 of counter IC370, is coupled to pin 4 of flip/flop 368A.

The output, pin 11 of AND gate 354A, is coupled to the clock input, pin 2 of a 74165 parallel to serial shift register IC374, and to the up clock, pin 5, of a 74193 counter IC376. Pins 1, 4, 9, 10, 11, 15 and 16 of IC376 are coupled to Vcc. Pin 8 of IC376 is coupled to ground. Pins 3, 12 and 13 of IC376 are left open. Output, pin 2 of counter IC376, is coupled to an input, pin 5, of a first NAND gate 378A of a 7400 quad two-input NAND gate. Output, pin 6 of counter IC376, is coupled to a first input, pin 2, of an AND gate 354B. Output, pin 7 of IC376, is coupled to the second input, pin 1 of IC354B, and to the second input, pin 4, of IC378A. The output, pin 6 of NAND gate IC378A, is coupled to pin 1 of register IC374 and serves to load (when low) and shift (when high) a character. The output, pin 3 of AND gate IC354B, is coupled to the up clock input, pin 5 of a 74193 counter IC380, and to a first input, pin 4, of 7432 OR gate IC360B. The clear input, pin 14 of counter IC376, is coupled to the output, pin 6, of OR gate IC360B.

The Q2 output, pin 5 of one shot multivibrator 346B is also coupled to the clear input, pin 14, of two 74193 counters IC380 and IC382.

Pins 1, 9, 10, 11, 15 and 16 of counter IC382 are coupled to Vcc. Pin 8 of IC382 is coupled to ground. Outputs, pins 6, 7, and carry and borrow outputs pins 12 and 13, respectively, of IC382 are left open. The down clock input, pin 4, is coupled to the borrow output, pin 13, of counter IC380. The up clock input, pin 5 of IC382, is coupled to the carry output, pin 12, of IC380.

Pins 1, 4, 9, 10, 11, 15 and 16 of IC380 are coupled to Vcc. Pin 8 of IC380 is coupled to ground. The output, pins 3, 2, 6 and 7, of IC380, is coupled to one set of inputs, pins 3, 6, 10 and 13, respectively, of a 74157 one-of-two select IC384. In addition, the output, pin 3 of counter IC380, is coupled to the input, pin 1, of 7408 two-input AND gate IC366B. A second input to AND gate IC366B, at pin 2, is an output, pin 2, from counter IC382. The output, pin 3 of IC382, is coupled to one input, pin 3, of a first set of inputs to a 74157 one-of-two select IC386. The output, pin 3 of AND gate IC366B, is coupled to the second input, pin 5, of OR gate 360B, to the up clock input, pin 5 of counter IC372, and to the second input, pin 10, of OR gate IC360A.

Pins 4 and 16 of counter IC372 are coupled to Vcc. Pins 1, 8, 9, 10 and 15 of IC372 are coupled to ground. Output, pins 3, 6 and 7 of IC372, are coupled to inputs 1, 2 and 13, respectively, of a 7410 three-input NAND gate IC388. In addition, the outputs, pins 3, 2, 6 and 7 of IC372, are coupled to inputs, pins 21, 22, 23 and 24, respectively, of a MC66790 character generator IC390. The output, pin 12 of NAND gate IC388, is coupled to the LOAD input, pin 11, of IC372, and to the up clock input, pin 5, of counter IC370. The borrow output, pin 13 of IC372, is left open. The carry output, pin 12 of IC372, is coupled to the down clock input, pin 4, of IC370.

Pins 1, 8, 9, 10 and 14 of IC370 are coupled to ground. Pins 15 and 16 of IC370 are coupled to Vcc. The borrow output, pin 13 of IC370, is left open. Output, pins 3, 2 and 6 of counter IC370 are coupled to the remaining inputs, pins 6, 10 and 13, respectively, of the first set of inputs to the one-of-two select IC386. The final output, pin 7 of IC370, is coupled to input, pin 3, of a 74157 one-of-two select IC392.

The second set of inputs to the one-of-two selects IC384, IC386 and IC392 is a 10-line VIDEO ADDRESS BUS from the MPU INTERFACE BOARD. Specifically, the 10-line VIDEO ADDRESS BUS is coupled to inputs, pins 2, 5, 11 and 14 of selects IC384 and IC386, and to pins 2 and 5 of select IC392. Pins 15 and 8 of selects IC384, IC386, and IC392 are coupled to ground. Pin 16 of selects IC384, IC386 and IC392 is coupled to Vcc. The select input, pin 1 of selects IC384, IC386 and IC392, is coupled to the output, pin 8, of 7408 two-input AND gate IC354C.

The outputs, pins 4, 7, 9 and 12 of selects IC384 and IC386, and pins 4 and 7 of select IC392, provide the address input to two MM2114 1K×4 RAMS IC394 and IC396. The RAMS IC394 and IC396 cooperate so as to provide a 1K×8-bit RAM. Specifically, outputs, pins 4, 7, 9 and 12 of select IC384, are coupled to pins 5, 6, 7 and 4, respectively, of RAMS IC394 and IC396. Outputs, pins 4, 7, 9 and 12 of select IC386 are coupled to pins 3, 2, 1 and 17, respectively, of RAMS IC394 and IC396. Finally, outputs, pins 4 and 7 of IC392, are coupled to pins 16 and 15, respectively, of RAMS IC394 and IC396. Outputs, pins 9 and 12 of IC392, are left open. Input, pin 6 of IC392, is coupled to a PAGE SELECT signal from MPU INTERFACE BOARD (IC406 Pin 14). Inputs, pins 10, 11, 13 and 14 of IC392, are also left open. The input/output pins of RAMS IC394 and IC396, pins 14, 13, 12 and 11, are coupled to pins 2 through 9 of a 74LS245 transceiver IC398. Pins 8 and 9 of RAMS IC394 and IC396 are coupled to ground. Pin 18 of IC394 and IC396 is coupled to Vcc. The data through RAMS IC394 and IC396 are write enabled at pin 10 by the output, pin 3, of a 7432 OR gate IC362C.

The output of OR gate IC362C is also coupled to the direction input, pin 1, of transceiver IC398. The transceiver IC398 is enabled at pin 19 by the output, pin 8, of AND gate IC354C. The output of AND gate IC354C is also coupled to the input, pin 2, of OR gate IC362C to pin 19 of transceiver IC398, and to pin 1 of selects IC384, IC386 and IC392. Pin 20 of IC398 is coupled to Vcc. Pin 10 of IC398 is coupled to ground. The second set of data pins of the transceiver IC398, pins 11 through 18, are coupled to an 8-line VIDEO DATA BUS from the MPU INTERFACE BOARD. The other input of IC362C, pin 1, is coupled to the READ/WRITE signal from the MPU INTERFACE BOARD (IC416 Pin 7). The two inputs to AND gate IC354C are coupled to separate CRT SELECT signals, from the MPU INTERFACE BOARD, (IC418 Pins 1, 2).

Pins 14, 13, 12 and 11 of RAM IC394, and RAM IC396 are coupled to pins 15, 16, 12, 11, 9, 8 and 4, respectively, of character generator IC390. Pin 11 of RAM IC396 is coupled to the input, pin 4, of a 7408 two-input AND gate IC354D. The other input of IC354D, pin 5, is coupled to Vcc. The output of AND gate IC354D, pin 6, is coupled to the inputs, pins 4, 13, 9 and 2, of two 7486 quad exclusive OR gates IC400 and IC402. Pins 1, 3, 10, 13 and 14 of IC390 are coupled to ground. Pin 2 of IC390 is coupled to Vcc. The outputs, pins 17, 7, 18 and 6 of IC390, are coupled to the inputs, pins 5, 12, 10 and 1, respectively, of quad exclusive OR gates IC400. The outputs, pins 19, 5 and 20 of IC390, are coupled to the inputs, pins 5, 10 and 1, respectively, of three of the four exclusive OR gates of IC402. The input, pin 12 of IC402, is coupled to GND.

The outputs, pins 6, 11, 8 and 3 of IC400, are coupled to the inputs, pins 11, 12, 13 and 14 of the Parallel-to-Serial register IC374. The outputs, pins 6, 8, 3 and 11 of IC402, are coupled to the inputs, pins 3, 4, 5 and 6, of IC374. In addition, pin 11 of IC402 is coupled to the serial in input, pin 10, of IC374. Pin 16 of IC374 is coupled to Vcc. Pins 8 and 15 of IC374 are coupled to ground. The output of register IC374, pin 9, is coupled to the input, pin 5, of 7408 AND gate IC366C. The other input of AND gate IC366C, pin 4, is coupled to the inverted output of OR gate IC360A, pin 8. The output of AND gate IC366C, pin 6, is the CRT PAGE signal which is input to AND gate 184D, pin 1 of the any-of-four IC184 in the FRONT END.

Figure 29A:
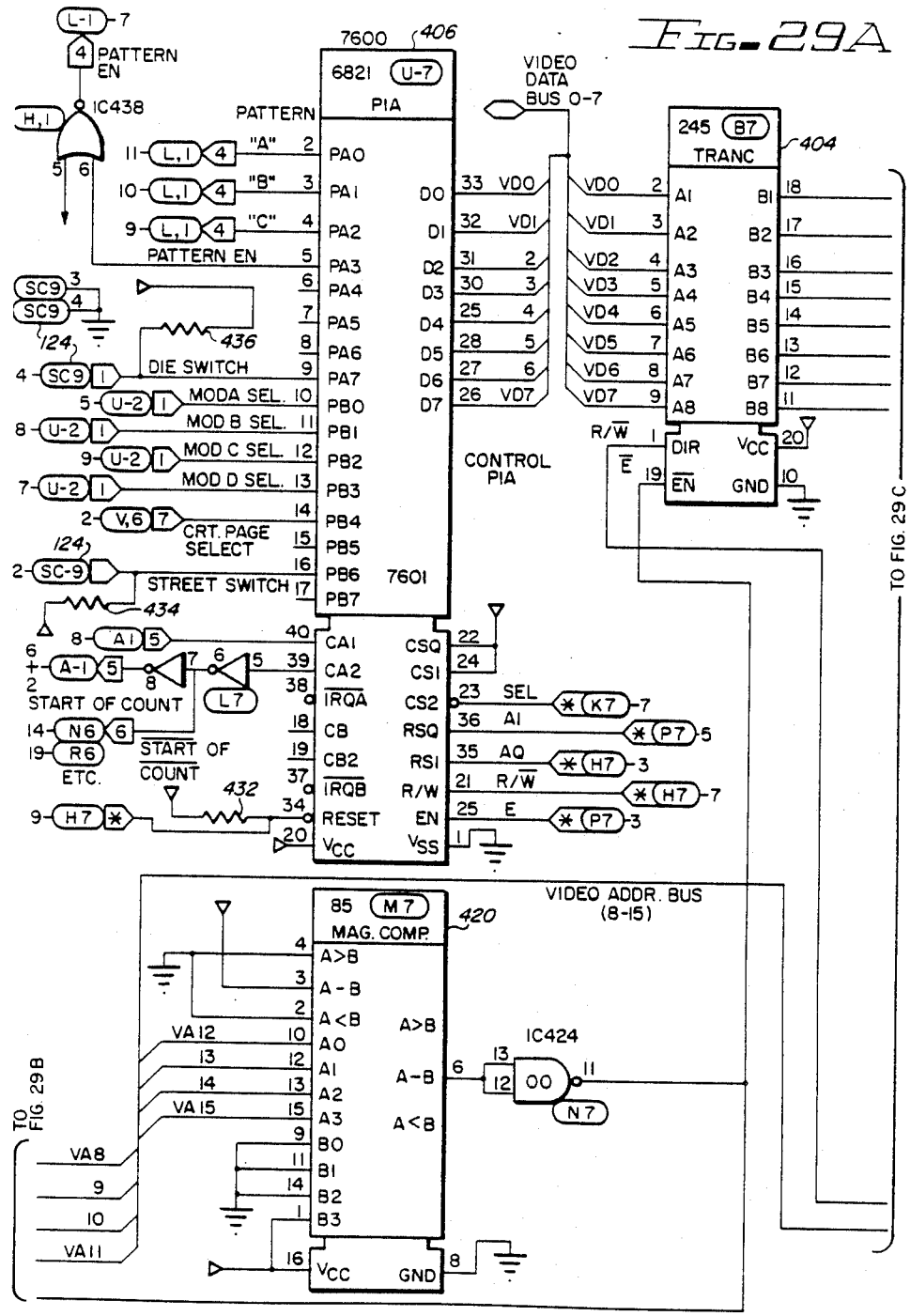
FIG. 29 is a diagram of a circuit which functions as the MPU INTERFACE BOARD.
Figure 29C:
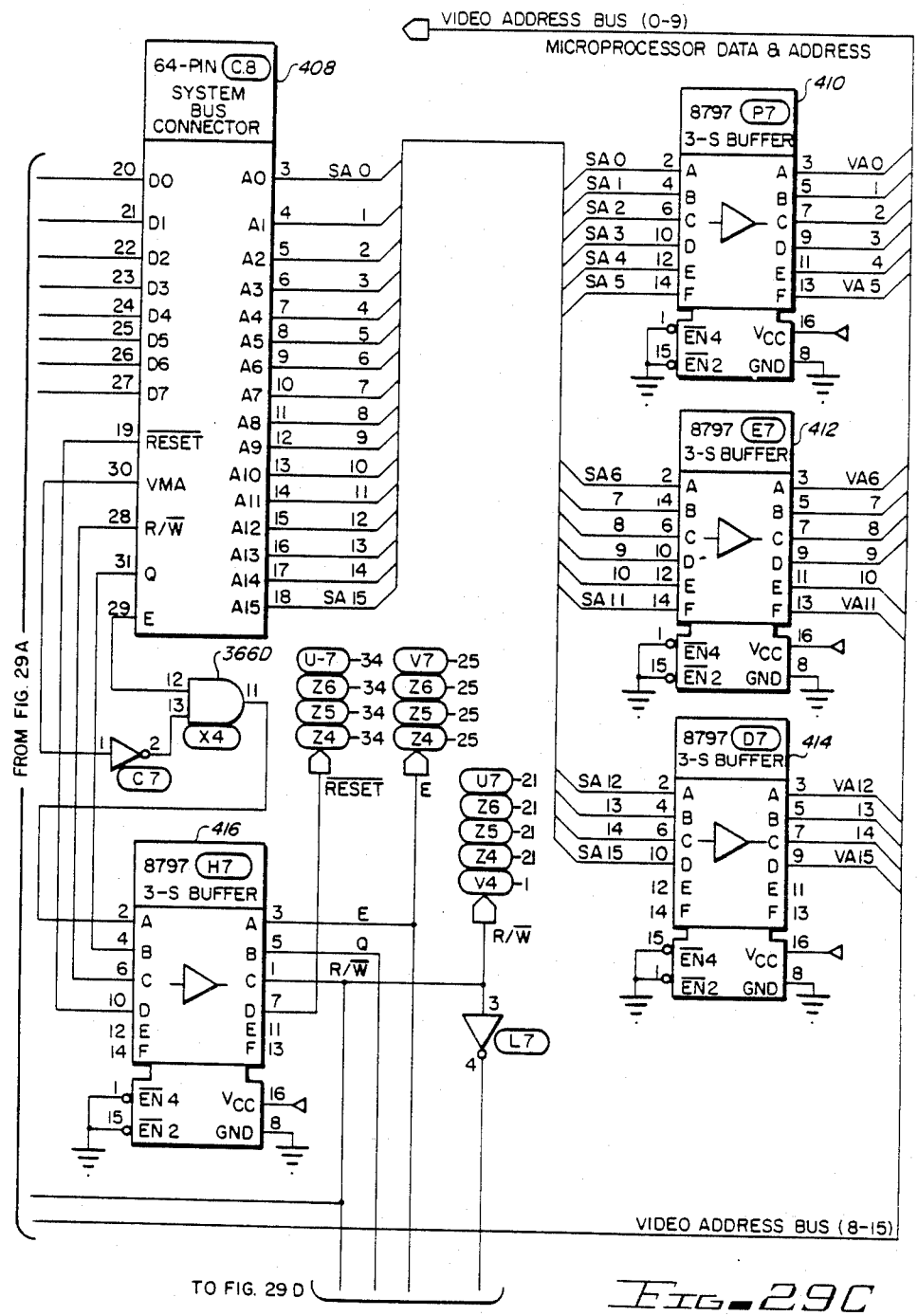
Figures 29, 29D:
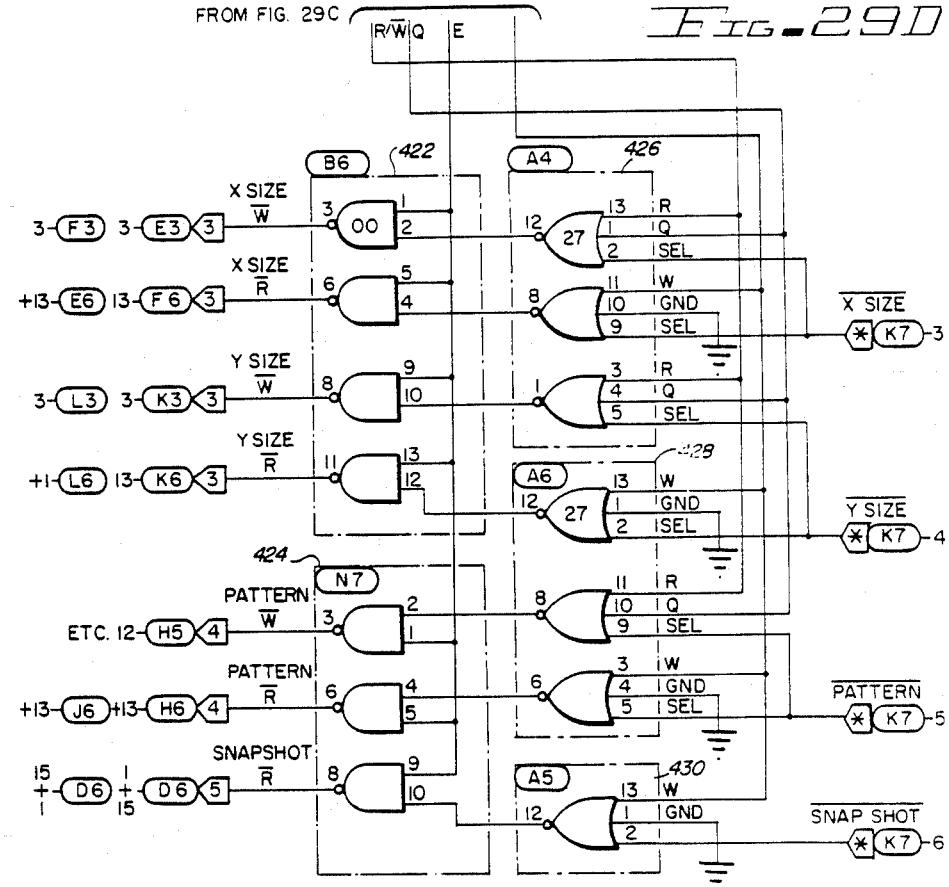

Shown in FIG. 29 is the MPU INTERFACE BOARD which allows the system's MPU to access the previously referenced circuits. The 8-line VIDEO DATA BUS originates from pins 2 through 9 of a 74LS245 transceiver IC404, and goes to pins 33 through 26 of a MC6821 PIA IC406. Pins 18 through 11 of transceiver IC404 are coupled to pins 20 through 27, respectively, of a 64 pin microprocessor system bus connector 408. Pin 20 of IC404 is coupled to Vcc. Pin 10 of IC404 is coupled to ground. Pins 3 through 18 of connector 408 form a 16-line address bus. Six lines of the address bus, pins 3 through 8 of connector 408, are connected to pins 2, 4, 6, 10, 12 and 14, respectively, of an 8T97 tri-state buffer IC410. Similarly, pins 9 through 14 of connector IC408 are connected to pins 2, 4, 6, 10, 12 and 14, respectively, of another 8T97 tri-state buffer IC412. Pins 15 through 18 of 408 are coupled to pins 2, 4, 6 and 10, respectively, of a third 8T97 tri-state buffer IC414. Pin 19 of connector 408 represents a RESET signal which is coupled to pin 10 of a fourth 8T97 tri-state buffer IC416. Pin 28 of 408 represents the READ/WRITE (R/W) signal which is input into pin 6 of buffer IC416. Pin 29 of 408 is coupled to pin 12, the input of a 7408 AND gate IC366D. Pin 30 of 408 is inverted and coupled to pin 13, the second input of AND gate IC366D. The output, pin 11, of AND gate IC366D represents an enable clock (E) signal which is coupled to pin 2 of buffer IC416. Pin 31 of 408 represents a Q signal which is coupled to pin 4 of buffer IC416.

The output of buffer IC410, pins 3, 5, 7, 9, 11 and 13, form 6 lines of the 10-line VIDEO ADDRESS BUS. Part of the output of IC412, pins 3, 5, 7 and 9, provides the remaining 4 lines that constitute the VIDEO ADDRESS BUS. Pins 7, 9, 11 and 13 of buffer IC412 are coupled to pins 23, 22, 21 and 20 of a 74154 decoder IC418. Pins 3, 5, 7 and 9 of buffer IC414 are coupled to pins 10, 12, 13 and 15 of 7485 magnitude comparator IC420. Pin 16 of buffers IC410, IC412, IC414 and IC416 is coupled to Vcc. Pin 8 of IC410, IC412, IC414 and IC416 is coupled to ground. In addition, pins 1 and 15 of buffers IC410, IC412, IC414 and IC416 are coupled to ground. Pins 11, 12, 13 and 14 of buffer IC414 and IC416 are left open.

The output, pin 3 of buffer IC416, represents the enable clock (E) signal which is coupled to the PIA's of the COUNTER circuit of FIG. 23 and to pin 25 of PIA IC406. The (E) signal from pin 3 of IC416 is also coupled to pins 1, 5, 9 and 13 of a 7400 quad two-input NAND gate IC422, and to pins 1, 5 and 9 of a 7400 quad two-input NAND gate IC424. The output, pin 5 of buffer IC416, respresents a Q signal which is coupled to pins 1 and 4 of two gates of a 7427 tri three-input NOR gate IC426 and to pin 10 of one gate of a 7427 tri three-input NOR gate IC428. The output, pin 7 of buffer IC416, represents the buffered R/W signal which is coupled to pin 21 of the PIA's of the COUNTER circuit in FIG. 23, to pin 21 of PIA IC406, and to pin 1 of OR gate IC326C of the PATTERN LOOK UP circuit of FIG. 27. In addition, the R/W signal from pin 7 of IC416 is also coupled to the direction input, pin 1 of transceiver IC404, and thus determine data flow direction to and from the MPU INTERFACE BOARD. The R/W signal from IC416, pin 7, is also coupled to pins 13 and 3 of two gates of IC426 and to pin 11 of one gate of IC428. The R/W signal from IC416, pin 7, is also inverted and input to pin 11 of the third NOR gate of IC426, to pins 13 and 3 of the two remaining NOR gates of IC428, and to pin 13 of one gate of a 7427 tri three-input NOR gate IC430. Pin 9 of buffer IC416 represents a RESET signal which is input to pin 34 of the PIA's of the COUNTER circuit of Figure and to pin 34 of PIA IC406.

PIns 2, 4 and 8 of comparator IC420 are coupled to ground. Pins 1, 3, and 16 of IC420 are coupled to Vcc. Pins 9, 11 and 14 are tied to ground. The comparator IC420 defines the hex address (at pins 9, 11, 4 and 1) for the software package. As shown, the hex address is 8XXX. Pins 5 and 7 of IC420 are left open. Pin 6 of IC420 is inverted by being input to pins 12 and 13 of the fourth 7400 NAND gate of IC424. The output of the fourth NAND gate of IC424, pin 11, represents a address decoding enable signal which is coupled to pin 19 of transceiver IC404 and to pin 19 of decoder IC418.

Pins 12 and 18 of IC418 are coupled to ground. Pin 24 of IC418 is coupled to Vcc. Pins 11 and 13 through 17 of IC418 are left open. Pins 1 and 2 of decoder IC418 represent CRT SELECT signals and are coupled to the 7400 gate IC354C at pins 9 and 10, respectively. Pins 8, 9 and 10 of IC418 represent PIA A SEL, PIA B SEL and PIA C SEL signals which are coupled to the PIA's of the COUNTER block. The output, pin 7 of decoder IC418, is coupled to the select input, pin 23 of PIA IC406. The output, pin 6 of IC418, represents a $\overline{\text{SNAP SHOT}}$ signal and is coupled to pin 2 of NOR gate IC430, to pin 13 of NAND gate IC230 and to pin 1 of selects IC256 and IC258 of the COUNTER circuit of FIG. 23. The output, pin 5 of IC418, is a $\overline{\text{PATTERN}}$ signal which is coupled to pins 5 and 9 of two NOR gates in IC428. The $\overline{\text{PATTERN}}$ signal is also inverted and becomes a PATTERN SEL signal which is coupled to pin 1 of selects IC276 and IC302 of the X-SIZE and Y-SIZE block generators. Pin 4 of IC418 represents a Y-SIZE signal which is coupled to pin 2 of IC428 and to pin 5 of IC426. The $\overline{\text{Y-SIZE}}$ signal from pin 4 of IC418 is also inverted and becomes a Y-SIZE SEL signal which is coupled to pin 1 of select IC300 of the Y-SIZE block generator. The output, pin 3 of IC418, is a X-SIZE signal which is coupled to pins 2 and 9 of IC426. The $\overline{\text{X-SIZE}}$ signal from pin 3 of IC418 is also inverted and becomes a X-SIZE SEL signal which is coupled to pin 1 of IC272 of the X-SIZE block generator.

The outputs, pins 12, 8 and 6 of IC426, and pin 12 of IC428, are coupled to pins 2, 4, 10 and 12, respectively, of the quad two-input NAND gates of IC422. The outputs, pins 8 and 6 of the remaining NOR gates of IC428, and pin 12 of NOR gate IC430, are coupled to the inputs, pins 2, 4 and 10, respectively, of the first three NAND gates of IC424.

The output, pin 3 of the first NAND gate of IC422, represents the X-SIZE $\overline{\text{WRITE}}$ ($\overline{\text{W}}$) signal which is coupled to pin 3 of X-SIZE RAMS IC268 and IC270. The output, pin 6 of IC422, represents the X-SIZE $\overline{\text{READ}}$ ($\overline{\text{R}}$) signal which is coupled to pins 1, 4, 10 and 13 of the data line buffers IC278 and IC282 of the X-SIZE block generator. The output, pin 8 of the third NAND gate of IC422, represents the Y-SIZE $\overline{\text{WRITE}}$ ($\overline{\text{W}}$) signal which is coupled to pin 3 of the Y-SIZE RAMS IC296 and IC298. The output of the last NAND gate of IC422, pin 11, represents the Y-SIZE $\overline{\text{READ}}$ ($\overline{\text{R}}$) signal which is coupled to pins 1, 4, 10 and 13 of buffers IC310 and IC312. The output, pin 3 of the first NAND gate of IC424, represents the PATTERN $\overline{\text{WRITE}}$ ($\overline{\text{W}}$) signal which is coupled to pin 12 of the PATTERN LOOKUP RAMS of FIG. 27. The output, pin 6 of the second NAND gate of IC424, is a PATTERN $\overline{\text{READ}}$ ($\overline{\text{R}}$) signal which is coupled to pins 1, 4, 10 and 13 of buffers IC336 and IC338. Finally, the output, pin 8 of the third NAND gate of IC424 represents a SNAP-SHOT $\overline{\text{READ}}$ ($\overline{\text{R}}$) signal which is coupled to pins 1 and 15 of the tri-state buffers IC260 and IC262.

Pins 20, 22 and 24 of PIA IC406 are coupled to Vcc. Pin 34 of IC406 is coupled to Vcc through a 10 Kohm pull up resistor 432 and receives a $\overline{\text{RESET}}$ signal from buffer IC416. Pin 1 of IC406 is coupled to ground. Pins 6, 7, 8, 18, 19, 37 and 8 of IC406 are left open. Pin 40 of IC406 receives the END OF COUNT input signal from the ARMING circuit of FIG. 21. Pin 17 of IC406 represents a STREET SWITCH signal and is coupled to Vcc through a 10 Kohm pull up resistor 434 and pin 12 of connector 124. Pins 10, 11, 12 and 13 of IC406 represent the MOD A SEL, MOD B SEL, MOD C SEL AND MOD D SEL signals, respectively, which are coupled to the AND gates of IC184 in the FRONT END of FIG. 21. Pin 14 of IC406 is the CRT PAGE SEL signal which is coupled to pin 6 of select IC392 of the PATTERN GENERATOR circuit of FIG. 27. Pin 9 of IC406 represents a DIE SWITCH signal and is coupled to Vcc through a 10K pull up resistor 436 and to pin 4 of connector 124. Pins 3 and 11 of connector 124 are coupled to ground. Pin 5 of IC406 is the PATTERN EN signal which is coupled to pin 6 of two-input NOR gate IC438. The other input of NOR gate IC438, pin 5, is coupled to ground. The output of NOR gate IC438, pin 4, is coupled to pin 7 of select IC344 of the PATTERN LOOK UP RAM of FIG. 27. Finally, pins 2, 3 and 4 of PIA IC406 represent PATTERN A, PATTERN B and PATTERN C signals which are coupled to pins 11, 10 and 9 of select IC344 of the PATTERN LOOK UP RAM.

The above detailed circuit description is given by way of example only. Changes in form and details may be made by one skilled in the art without departing from the spirit and scope of the invention as defined in the appended claims.

For example, whereas the invention has been disclosed as being controlled by a Motorola 6809 microprocessor (see Reference: MC6809 Preliminary Programming Manual, Motorola, Inc., 1979), the software program could be converted and various hardware changes could be made to adapt the invention to be controlled by other types of microprocessors such as the 8080 and 8086 as made by Intel.

A program for operating the apparatus set forth above is listed in U.S. Pat. No. 4,520313 and is incorporated herein by reference

What is claimed is:

1. An apparatus for testing a semiconductor die surrounded by a border region, comprising:
   first scanning means for scanning preselected regions of a video scene of a semiconductor die to generate digital video signals corresponding thereto;
   memory means for storing a first digitized video signal, said memory means connected to said first means;
   counter means for storing a second digitized signal; and
   comparison means for examining the contents of said memory means to locate an edge of said semiconductor die and the contents of said counter means to locate defects in the surface of said semiconductor die, said comparison means operably connected to said counter means and said memory means.

2. An apparatus according to claim 1 wherein said first means comprises:
   a video camera for scanning said preselected regions to produce a video signal;
   first digitizing means for digitizing said video signal such that a first light level is represented by a first potential and a first dark level is represented by a second potential;
   second digitizing means for digitizing said video signal such that a second light level is represented by said first potential and a second dark level is represented by said second potential.

3. An apparatus according to claim 2 wherein said first potential is a logical high voltage level and said second potential is a logical low voltage level.

4. An apparatus according to claim 2 wherein said first light level represents the surface of said semiconductor die, said first dark level represents said border area adjacent to said semiconductor die, said second light level represents a defect free area on the surface of said semiconductor die, and said second dark level represents a defect on the surface of said semiconductor die.

5. An apparatus according to claim 4 wherein said second means sums and averages the occurrences of said first potential from said first digitized video signal stored in said memory means so as to locate an edge of said semiconductor die.

6. An apparatus according to claim 5 wherein said second means sums the occurrences of said first potential from said second digitized signal stored in said counter means, and compares said occurrences of said first potential to an acceptable reference number which represents a good semiconductor die, to determine if an unacceptable number of defects are present in the surface of said semiconductor die.

7. An apparatus according to claim 1 further comprising means for programming the size and location of said preselected regions.

8. An apparatus according to claim 1 further comprising means for displaying on a video screen, in combination, said first and second digitized video signals; said preselected regions; and alpha graphics.

* * * * *